United States Patent
Sakii et al.

(10) Patent No.: US 10,790,461 B2
(45) Date of Patent: Sep. 29, 2020

(54) FIELD-EFFECT TRANSISTOR, METHOD FOR MANUFACTURING THE SAME, AND WIRELESS COMMUNICATION DEVICE AND GOODS TAG INCLUDING THE SAME

(71) Applicant: TORAY INDUSTRIES, INC., Tokyo (JP)

(72) Inventors: Daisuke Sakii, Shiga (JP); Seiichiro Murase, Shiga (JP); Junji Wakita, Tokyo (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 16/462,447

(22) PCT Filed: Nov. 16, 2017

(86) PCT No.: PCT/JP2017/041360
§ 371 (c)(1),
(2) Date: May 20, 2019

(87) PCT Pub. No.: WO2018/097042
PCT Pub. Date: May 31, 2018

(65) Prior Publication Data
US 2019/0378998 A1 Dec. 12, 2019

(30) Foreign Application Priority Data
Nov. 22, 2016 (JP) .................. 2016-226483

(51) Int. Cl.
*H01L 29/86* (2006.01)
*H01L 51/05* (2006.01)
(Continued)

(52) U.S. Cl.
CPC ........ *H01L 51/052* (2013.01); *G06K 19/0723* (2013.01); *H01L 51/0003* (2013.01);
(Continued)

(58) Field of Classification Search
CPC . H01L 51/052; H01L 51/0545; H01L 51/055; H01L 51/105; H01L 51/0034;
(Continued)

(56) References Cited

U.S. PATENT DOCUMENTS 8,530,889 B2    9/2013   Jo et al.
9,837,613 B2 *   12/2017   Mitchell ................ B82Y 10/00
(Continued)

FOREIGN PATENT DOCUMENTS

CN     101009223 A    8/2007
CN     102089870 A    6/2011
(Continued)

OTHER PUBLICATIONS

English translation of Chinese Office Action for Chinese Application No. 201780070725.X, dated Dec. 17, 2019.
(Continued)

*Primary Examiner* — Dung A. Le
(74) *Attorney, Agent, or Firm* — Birch, Stewart, Kolasch & Birch, LLP

(57) ABSTRACT

A field-effect transistor includes: a substrate; a source electrode; a drain electrode; a gate electrode; a semiconductor layer in contact with the source electrode and with the drain electrode; and a gate insulating layer insulating between the semiconductor layer and the gate electrode. The gate insulating layer comprising at least a polysiloxane having a structural unit represented by a general formula (1):

(1)

(Continued)

in the general formula (1), $R^1$ represents a hydrogen atom, an alkyl group, a cycloalkyl group, a heterocyclic group, an aryl group, a heteroaryl group, or an alkenyl group; $R^2$ represents a hydrogen atom, an alkyl group, a cycloalkyl group, or a silyl group; m represents 0 or 1; $A^1$ represents an organic group including at least two groups selected from a carboxy group, a sulfo group, a thiol group, a phenolic hydroxy group, or a derivative of these groups.

16 Claims, 2 Drawing Sheets

(51) Int. Cl.
    *G06K 19/07*     (2006.01)
    *H01L 51/00*     (2006.01)
    *H01L 51/10*     (2006.01)

(52) U.S. Cl.
    CPC ........ *H01L 51/0034* (2013.01); *H01L 51/055* (2013.01); *H01L 51/0545* (2013.01); *H01L 51/105* (2013.01); *H01L 51/0558* (2013.01)

(58) Field of Classification Search
    CPC ............ H01L 51/0003; H01L 51/0558; G06K 19/0723
    See application file for complete search history.

(56) References Cited

U.S. PATENT DOCUMENTS

| | | | |
|---|---|---|---|
| 2011/0068417 | A1 | 3/2011 | Murase et al. |
| 2011/0121273 | A1* | 5/2011 | Jo .......................... C01B 32/174 257/40 |

FOREIGN PATENT DOCUMENTS

| | | |
|---|---|---|
| JP | 2008-107529 A | 5/2008 |
| JP | 4853228 B2 | 1/2012 |
| JP | 2012-107113 A | 6/2012 |
| JP | 2013-28724 A | 2/2013 |
| JP | 2014-197171 A | 10/2014 |
| JP | 2015-198115 A | 11/2015 |
| WO | WO 2009/116373 A1 | 9/2009 |
| WO | WO 2009/139339 A1 | 9/2011 |

OTHER PUBLICATIONS

Office Action dated Jan. 17, 2020, in Korean Patent Application No. 10-2019-7013034.
International Search Report, issued in PCT/JP2017/041360, PCT/ISA/210, dated Feb. 13, 2018.
Written Opinion of the International Searching Authority, issued in PCT/JP2017/041360, PCT/ISA/237, dated Feb. 13, 2018.
Chinese Office Action and Search Report for Chinese Application No. 201780070725.X, dated Dec. 17, 2019.

* cited by examiner

FIELD-EFFECT TRANSISTOR, METHOD FOR MANUFACTURING THE SAME, AND WIRELESS COMMUNICATION DEVICE AND GOODS TAG INCLUDING THE SAME

FIELD

The present invention relates to a field-effect transistor, a method for manufacturing the same, as well as a wireless communication device and a goods tag including the same.

BACKGROUND

A field-effect transistor (FET) using an organic semiconductor and/or a carbon material in the semiconductor layer thereof has been extensively investigated in recent years. Semiconductor material like this is soluble in an organic solvent, so that a thin film can be formed with a low cost by means of an application method such as an ink jet printing. In this case, in order to obtain stable electric characteristics of an FET, a smoothly and uniformly coated semiconductor layer needs to be formed.

An important member of the FET is a gate insulating layer. Usually, a semiconductor layer is formed in contact with the gate insulating layer; and in the semiconductor layer, a channel through which an electric current runs is formed near the interface with the gate insulating layer. Accordingly, the surface property of the gate insulating layer can significantly affect the FET characteristics.

An organic material such as an organic polymer that is soluble in an organic solvent is also being under an active study as the material for the gate insulating layer. With this material, a thin film can be formed by an inexpensive application method such as a slit coating method; and in addition, this can be formed onto a flexible substrate by a low temperature process.

As an example of the application-type material for the gate insulating layer that is soluble in an organic solvent, a polysiloxane having an epoxy group introduced therein is known (for example, see Patent Literature 1). Patent Literature 1 indicates that the epoxy group suppresses repulsion of the semiconductor solution so that not only the semiconductor solution can be applied onto the gate insulating layer sufficiently well but also a hysteresis can be lowered.

In the gate insulating layer, a contact hole needs to be opened in order to obtain an electric conduction to a lower electrode. For formation of a hole pattern thereof, a photolithography process using a photoresist is usually carried out. On the other hand, in the polysiloxane having the epoxy group introduced therein, the pattern can be formed by means of a photolithography without using a photoresist by further including a photoacid generator.

In addition, the gate insulating layer material utilizing a photo-curable composition including a polysiloxane having a heterocyclic group has been known (for example, see Patent Literature 2). Patent Literature 2 indicated that the polysiloxane having a heterocycle introduced therein can improve applicability of an organic semiconductor to be applied onto the gate insulating layer.

On the other hand, it is also known that a photosensitive resin composition utilizing a polysiloxane including an organosilane unit having an acid group can be used in a flattening film of a thin film transistor (for example, see Patent Document 3). Patent Literature 3 indicates that the polysiloxane including an organosilane unit having an acid group can enhance a resolution at the time of patterning by means of an alkali development.

CITATION LIST

Patent Literature

Patent Literature 1: International Patent Publication No. 2009/116373
Patent Literature 2: Japanese Patent Application Laid-open No. 2015-198115
Patent Literature 3: Japanese Patent Application Laid-open No. 2014-197171

SUMMARY

Technical Problem

In Patent Literature 1, due to the polysiloxane having the epoxy group introduced therein, there were effects to improve applicability of the semiconductor solution as well as to reduce a hysteresis; however, because of a poor interaction among the polysiloxanes, a crack resistance is low. Accordingly, there was a problem of an increase in a leak current. In addition, in the patterning of the gate insulating layer by means of a photolithography, there was a problem of insufficient resolution thereby making it difficult to form a fine pattern.

In Patent Literature 2, due to the polysiloxane having a heterocyclic group, there was an effect to improve applicability of the semiconductor solution; however, this was unsatisfactory in view of reduction of the hysteresis.

Patent Literature 3 indicates utilization of the polysiloxane including an organosilane unit having an acid group to the flattening film of the thin film transistor and the effect thereof to improvement in the resolution; however, there were no studies carried out with regard to applicability of the semiconductor solution and to the effects to the transistor characteristics such as hysteresis.

Accordingly, the present invention intends to provide a field-effect transistor with which uniform coating with a semiconductor solution can be performed, a hysteresis is reduced, and a crack resistance of the gate insulating layer is improved; and in addition, to provide a method for producing the same having a superior productivity.

Solution to Problem

A field-effect transistor according to the present invention includes at least: a substrate; a source electrode; a drain electrode; a gate electrode; a semiconductor layer in contact with the source electrode and with the drain electrode; and a gate insulating layer insulating between the semiconductor layer and the gate electrode, the semiconductor layer comprising an organic semiconductor and/or a carbon material, and the gate insulating layer comprising at least a polysiloxane having a structural unit represented by a general formula (1):

in the general formula (1), $R^1$ represents a hydrogen atom, an alkyl group, a cycloalkyl group, a heterocyclic group, an aryl group, a heteroaryl group, or an alkenyl group; $R^2$ represents a hydrogen atom, an alkyl group, a cycloalkyl group, or a silyl group; m represents 0 or 1; $A^1$ represents an organic group including at least two groups selected from a carboxy group, a sulfo group, a thiol group, a phenolic hydroxy group, or a derivative of these groups; when the derivative is a cyclic condensed structure formed by two groups out of the carboxy group, the sulfo group, the thiol group, and the phenolic hydroxy group, $A^1$ represents an organic group having at least one the cyclic condensed structure.

Advantageous Effects of Invention

With the field-effect transistor according to the present invention, a field-effect transistor can be obtained with which uniform coating with a semiconductor solution can be performed, a hysteresis is reduced, and a crack resistance of a gate insulating layer is improved; and a method for producing the same having a superior productivity.

DESCRIPTION OF EMBODIMENTS

Figure 1:
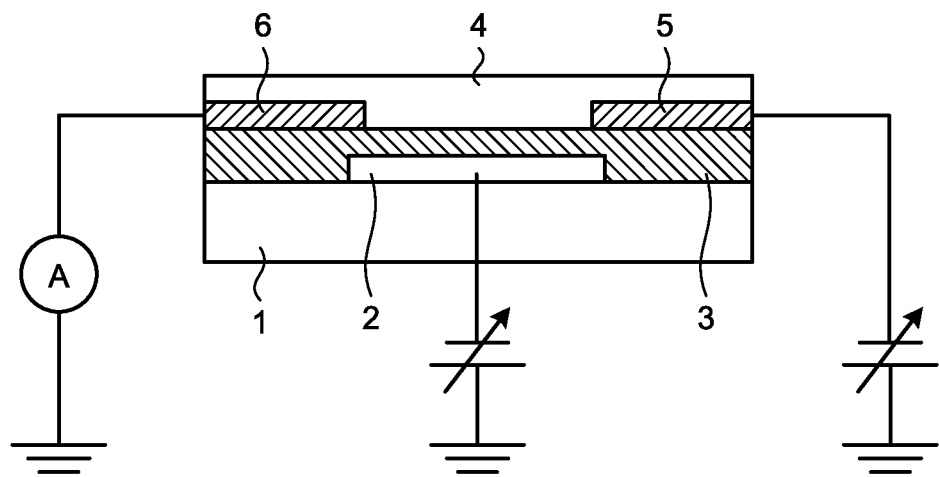
FIG. 1 is a schematic sectional view illustrating an example of the field-effect transistor according to the embodiment of the present invention.

Hereinafter, embodiments of a field-effect transistor (FET), a method for manufacturing the same, as well as a wireless communication device and a goods tag using the same according to the present invention will be explained in detail. Note that the present invention is not limited to the following embodiments, and thus, the invention may be carried out with variously modifying the embodiments in accordance with the purpose and use thereof.

The FET according to the present invention is a field-effect transistor including at least a substrate, a source electrode, a drain electrode, a gate electrode, a semiconductor layer in contact with the source electrode and with the drain electrode, and a gate insulating layer insulating between the semiconductor layer and the gate electrode, in which the semiconductor layer includes an organic semiconductor and/or a carbon material, and the gate insulating layer includes at least a polysiloxane having a structural unit represented by a following general formula (1).

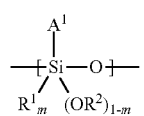

(1)

In the general formula (1), $R^1$ represents a hydrogen atom, an alkyl group, a cycloalkyl group, a heterocyclic group, an aryl group, a heteroaryl group, or an alkenyl group. $R^2$ represents a hydrogen atom, an alkyl group, a cycloalkyl group, or a silyl group. m represents 0 or 1. $A^1$ represents an organic group including at least two groups selected from a carboxy group, a sulfo group, a thiol group, a phenolic hydroxy group, or a derivative of these groups. Here, when the derivative is a cyclic condensed structure formed by two groups out of the carboxy group, the sulfo group, the thiol group, and the phenolic hydroxy group, $A^1$ represents an organic group having at least one the cyclic condensed structure. When $A^1$ includes two or more of the carboxy group, the sulfo group, the thiol group, the phenolic hydroxy group, or a derivative of these groups, both the embodiment in which two identical groups are included (for example, two carboxy groups are included) and the embodiment in which two different groups are included (for example, one carboxy group and one thiol groups are included) are included.

<Gate Insulating Layer>
(Polysiloxane)

The gate insulating layer in the present invention includes a polysiloxane and at least a structural unit represented by a general formula (1).

In the general formula (1), $R^1$ represents a hydrogen atom, an alkyl group, a cycloalkyl group, a heterocyclic group, an aryl group, a heteroaryl group, or an alkenyl group. $R^2$ represents a hydrogen atom, an alkyl group, a cycloalkyl group, or a silyl group. m represents 0 or 1. $A^1$ represents an organic group including at least two groups selected from a carboxy group, a sulfo group, a thiol group, a phenolic hydroxy group, or a derivative of these groups. Here, when the derivative is a cyclic condensed structure formed by two of the carboxy group, the sulfo group, the thiol group, and the phenolic hydroxy group, $A^1$ represents an organic group having at least one the cyclic condensed structure.

Illustrative examples of the alkyl group include saturated aliphatic hydrocarbon groups such as a methyl group, an ethyl group, an n-propyl group, an isopropyl group, an n-butyl group, a sec-butyl group, and a tert-butyl group, in which these groups may or do not necessarily include a substituent group. The additional substituent group optionally included therein is not particularly restricted, in which illustrated examples thereof include an alkoxy group, an aryl group, and a hetero-aryl group; and in addition, these groups may further include a substituent group. The carbon number of the alkyl group is not particularly restricted; but in view of an easy availability and a cost, the carbon number is preferably at least 1 and up to 20, while more preferably at least 1 and up to 8.

Illustrative examples of the cycloalkyl group include saturated alicyclic hydrocarbon groups such as a cyclopropyl group, a cyclohexyl group, a norbornyl group, and an adamantly group, in which these groups may or do not necessarily include a substituent group. The additional substituent group optionally included therein is not particularly restricted, in which illustrated examples thereof include an alkyl group, an alkoxy group, an aryl group, and a heteroaryl group; and in addition, these groups may further include a substituent group. Explanation with regard to these substituent groups is common in the description hereinafter. The carbon number of the cycloalkyl group is not particularly restricted, but preferably at least 3 and up to 20.

The heterocyclic group is the group derived from an aliphatic ring having inside the ring thereof an atom other than a carbon atom, such as a pyran ring, a piperidine ring, and an amide ring, in which these groups may or do not necessarily include a substituent group. The carbon number of the heterocyclic group is not particularly restricted, but preferably at least 2 and up to 20.

The aryl group is an aromatic hydrocarbon group, such as a phenyl group, a naphthyl group, a biphenyl group, an anthracenyl group, a phenanthryl group, a terphenyl group, and a pyrenyl group, in which these groups may or do not necessarily include a substituent group. The carbon number of the aryl group is not particularly restricted, but preferably in the range of 6 to 40.

The hetero-aryl group is an aromatic group including inside the ring thereof one or plural atoms other than a carbon atom, such as a furanyl group, a thiophenyl group, a benzofuranyl group, a dibenzofuranyl group, a pyridyl group, and a quinolinyl group, in which these groups may or do not necessarily include a substituent group. The carbon number of the hetero-aryl group is not particularly restricted, but preferably in the range of 2 to 30.

The alkenyl group is an unsaturated aliphatic hydrocarbon group including a double bond, such as a vinyl group, an allyl group, and a butadienyl group, in which these groups may or do not necessarily include a substituent group. The carbon number of the alkenyl group is not particularly restricted, but preferably in the range of at least 2 and up to 20.

The alkoxy group cited as the substituent group is a functional group having one of ether bonds thereof substituted with an aliphatic hydrocarbon group, such as a methoxy group, an ethoxy group, or a propoxy group, in which these aliphatic hydrocarbon groups may or do not necessarily include a substituent group. The carbon number of the alkoxy group is not particularly restricted, but preferably in the range of at least 1 and up to 20.

When the polysiloxane having the structural unit represented by the general formula (1) includes as $A^1$ an organic group having at least two groups selected from a carboxy group, a sulfo group, a thiol group, a phenolic hydroxy group, or a derivative of these groups, the semiconductor layer having an organic semiconductor and/or a carbon material coated uniformly can be formed. It is presumed that this can occur because these polar functional groups present on the surface of the insulating layer control a wetting property of the semiconductor solution thereby enabling an application without repulsion.

In the case where the derivative is a cyclic condensed structure formed by two groups out of the carboxy group, the sulfo group, the thiol group, and the phenolic hydroxy group, when $A^1$ includes an organic group having at least one cyclic condensed structure thereof, the same effects can be obtained.

The applicability of the semiconductor solution onto the gate insulating layer can be evaluated by measuring the contact angle of the semiconductor solution to the gate insulating layer by means of a sessile drop method. In view of uniform application without repulsion, the contact angle is preferably lower than 15°, more preferably lower than 12°, while still more preferably lower than 10°. On the other hand, because a certain film thickness is needed in order to have a stable action in FET, the contact angle is preferably 4° or higher, more preferably 5° or higher, while still more preferably 6° or higher.

When the polysiloxane having the structural unit represented by the general formula (1) has $A^1$, the hysteresis can be lowered, and the crack resistance can be enhanced.

The hysteresis represents a fluctuation range of the current value to a voltage history, so that the hysteresis value needs to be lowered in order to stably drive the FET. The hysteresis is preferably 20 V or lower, more preferably 10 V or lower, while still more preferably 5 V or lower.

Here, the crack is defined as the crack generated in the gate insulating layer, in which whether the crack is generated in the insulating layer can be observed with an optical microscope or the like. Generation of the crack causes an increase in a leak current, a line breakage, and the like, so that it is desirable to minimize the crack generation. When the ratio of the elements having the crack formed in the insulating layer to the total elements is expressed as "crack generation rate (%)", "100−crack generation rate (%)" can be used as an index of the crack resistance. Here, the crack resistance is preferably 95% or higher, more preferably 98% or higher, while still more preferably 100%.

When the polysiloxane having the structural unit represented by the general formula (1) has $A^1$, an excellent solubility to an alkali developing solution during lithography of the gate insulating layer can be realized. With this, patterning can be performed highly precisely in accordance with the designed size thereby realizing a high resolution. The resolution is preferably 30 μm or lower, more preferably 15 μm or lower, while still more preferably 5 μm or lower.

Among the derivatives of the carboxy group, the sulfo group, the thiol group, and the phenolic hydroxy group, illustrative examples of the non-cyclic condensed structure include a carboxylate ester, a sulfonate ester, a thioester, a thioether, and a phenyl ether with a hydrocarbon group or with a silyl group, as well as a carboxylic acid anhydride, and an amide compound or an imide compound formed by reaction of a carboxylic acid anhydride with an amine compound.

Illustrative examples of the cyclic condensed structure formed of two groups selected from the carboxy group, the sulfo group, the thiol group, and the phenolic hydroxy group include a cyclic acid anhydride structure, a cyclic ester structure, a cyclic thioester structure, a cyclic ether structure, and a cyclic thioether structure.

Condensation includes both those formed among the polysiloxanes themselves and those derived from other constituent materials. In the case of those formed among the polysiloxanes themselves, both those formed in its own molecule and those formed with other molecule are included.

In the present invention, the organic group represents an alkyl group, a cycloalkyl group, a heterocyclic group, an aryl group, a hetero-aryl group, or an alkenyl group, which have been mentioned already. Among these, in view of a low hysteresis, an alkyl group, a cycloalkyl group, an aryl group, and an alkenyl group are preferable; an alkyl group and an aryl group are more preferable, while an alkyl group is still more preferable.

As the silyl group, there is no particular restriction so far as it is a functional group having a bonding point of a Si atom. The silyl group may have a hydrogen atom, an organic group, or further a silyl group; or it may be formed via an oxygen atom. A polysiloxane may also be possible.

In view of improvement in the applicability of the semiconductor solution, as well as compatibility of both the low hysteresis and the crack resistance of the gate insulating layer, $A^1$ in the general formula (1) is preferably the organic group having at least two carboxy groups or derivatives thereof or at least one cyclic acid anhydride group, while more preferably the group represented by the following general formula (2) or (3).

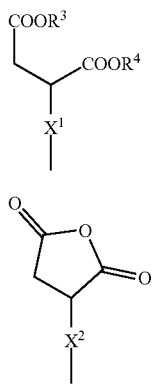

In the general formula (2), $X^1$ represents a single bond, an alkylene group having 1 to 10 carbon atoms, or an arylene group having 6 to 15 carbon atoms. $R^3$ and $R^4$ represent independently a hydrogen atom, an organic group, or a silyl group. In the general formula (3), $X^2$ represents a single bond, an alkylene group having 1 to 10 carbon atoms, or an arylene group having 6 to 15 carbon atoms.

In the polysiloxane having the structural unit represented by the general formula (1), in view of improvement in the applicability of the semiconductor solution, compatibility of the low hysteresis and the crack resistance of the gate insulating layer, and improvement in the resolution during lithography of the gate insulating layer, the content ratio of the structural unit represented by the general formula (1) that occupies in the entire silane structural units is preferably 0.5% by mole or higher, more preferably 1.0% by mole or higher, while still more preferably 1.5% by mole or higher. In view of avoiding an increase in the leak current due to moisture absorption, the content ratio is preferably 20% by mole or lower, more preferably 15% by mole or lower, while still more preferably 10% by mole or lower.

The leak current is the current that is leaked out to an unintended part in a circuit. In order to drive the FET with a low power consumption, the leak current needs to be small, so that this is preferably 30 pA or lower, more preferably 20 pA or lower, while still more preferably 10 pA or lower.

In the polysiloxane having the structural unit represented by the general formula (1), the content ratio of the structural unit represented by the general formula (1) that occupies in the entire silane structural units can be obtained from $^{13}$C-NMR. In the carboxy group and the derivatives thereof, the carbon atom of the carbonyl group appears characteristically in the chemical shift region of about 170 ppm to 180 ppm; in the sulfo group and the derivatives thereof, the carbon atom bonded to the S atom appears characteristically in the chemical shift region of about 30 ppm to 40 ppm; in the thiol group and the derivatives thereof, the carbon atom bonded to the S atom appears characteristically in the chemical shift region of about 10 ppm to 20 ppm; and in the phenolic hydroxy group and the derivatives thereof, the carbon atom, which is in the aromatic ring and bonded to the O atom derived from the phenolic hydroxide, appears characteristically in the chemical shift region of about 140 ppm to 170 ppm. From the peak area ratio of these peaks to the peaks of the carbon atoms in other structural units, the content ratio of the structural unit represented by the general formula (1) can be obtained.

As the structural unit represented by the general formula (1) used in the present invention, specific examples thereof as the silane compound include the structural units listed as follows. Namely, the structural units having the carboxy group or the derivative thereof are: dimethoxymethylsilylmethylsuccinic acid, diethoxymethylsilylmethylsuccinic acid, dimethoxyphenylsilylmethylsuccinic acid, diethoxyphenylsilylmethylsuccinic acid, trimethoxysilylmethylsuccinic acid, triethoxysilylmethylsuccinic acid, 2-[dimethoxy(methyl)silyl]ethylsuccinic acid, 2-[diethoxy(methyl)silyl]ethylsuccinic acid, 2-[dimethoxy(phenyl)silyl]ethylsuccinic acid, 2-[diethoxy(phenyl)silyl]ethylsuccinic acid, 2-(trimethoxysilyl)ethylsuccinic acid, 2-(triethoxysilyl)ethylsuccinic acid, 3-[dimethoxy(methyl)silyl]propylsuccinic acid, 3-[diethoxy(methyl)silyl]propylsuccinic acid, 3-[dimethoxy(phenyl)silyl]propylsuccinic acid, 3-[diethoxy(phenyl)silyl]propylsuccinic acid, 3-(trimethoxysilyl)propylsuccinic acid, 3-(triethoxysilyl)propylsuccinic acid, 4-[dimethoxy(methyl)silyl]butylsuccinic acid, 4-[diethoxy(methyl)silyl]butylsuccinic acid, 4-[dimethoxy(phenyl)silyl]butylsuccinic acid, 4-[diethoxy(phenyl)silyl]butylsuccinic acid, 4-(trimethoxysilyl)butylsuccinic acid, 4-(triethoxysilyl)butylsuccinic acid, 5-[dimethoxy(methyl)silyl]pentylsuccinic acid, 5-[diethoxy(methyl)silyl]pentylsuccinic acid, 5-[dimethoxy(phenyl)silyl]pentylsuccinic acid, 5-[diethoxy(phenyl)silyl]pentylsuccinic acid, 5-(trimethoxysilyl)pentylsuccinic acid, 5-(triethoxysilyl)pentylsuccinic acid, 6-[dimethoxy(methyl)silyl]hexylsuccinic acid, 6-[diethoxy(methyl)silyl]hexylsuccinic acid, 6-[dimethoxy(phenyl)silyl]hexylsuccinic acid, 6-[diethoxy(phenyl)silyl]hexylsuccinic acid, 6-(trimethoxysilyl)hexylsuccinic acid, 6-(triethoxysilyl)hexylsuccinic acid, anhydrides of compounds having any of these succinic acid structures, and structural units derived from compounds having gluconic acid in place of these succinic acids.

The structural units having the sulfo group or the derivative thereof are: 5-[dimethoxy(methyl)silyl]pentane-1,2-disulfonic acid, 5-[diethoxy(methyl)silyl]pentane-1,2-disulfonic acid, 5-[dimethoxy(phenyl)silyl]pentane-1,2-disulfonic acid, 5-[diethoxy(phenyl)silyl]pentane-1,2-disulfonic acid, 5-(trimethoxysilyl)pentane-1,2-disulfonic acid, 5-(triethoxysilyl)pentane-1,2-disulfonic acid, as well as the structural units derived from methyl esters, ethyl esters, n-propyl esters, isopropyl esters, n-butyl esters, sec-butyl esters, and t-butyl esters of the above-mentioned structural units.

The structural units having the thiol group or the derivative thereof are: 3-[3-[dimethoxy(methyl)silyl]propyloxy]propane-1,2-dithiol, 3-[3-[diethoxy(methyl)silyl]propyloxy]propane-1,2-dithiol, 3-[3-[dimethoxy(phenyl)silyl]propyloxy]propane-1,2-dithiol, 3-[3-[diethoxy(phenyl)silyl]propyloxy]propane-1,2-dithiol, 3-[3-(trimethoxysilyl)propyloxy]propane-1,2-dithiol, 3-[3-(triethoxysilyl)propyloxy]propane-1,2-dithiol, as well as the structural units derived from methyl thioethers, ethyl thioethers, n-propyl thioethers, isopropyl thioethers, n-butyl thioethers, sec-butyl thioethers, and t-butyl thioethers of the above-mentioned structural units.

The structural units having the phenolic hydroxy group or the derivative thereof are: a catechol, a resorcinol, a hydroquinone, or a fluoroglucinol, these having a 3-[dimethoxy(methyl)silyl]propyl group, a 3-[diethoxy(methyl)silyl]propyl group, a 3-[dimethoxy(phenyl)silyl]propyl group, a 3-[diethoxy(phenyl)silyl]propyl group, a 3-(trimethoxysilyl)propyl group, or a 3-(triethoxysilyl)propyl group, as well as the structural units derived from methyl ethers, ethyl ethers, n-propyl ethers, isopropyl ethers, n-butyl ethers, sec-butyl ethers, and t-butyl ethers of the above-mentioned structural units.

The structural units having a pair of different groups selected from the carboxy group, the sulfo group, the thiol group, the phenolic hydroxy group, and the derivatives thereof are: 1-carboxy-2-sulfo-5-(trimethoxysilyl)pentane, 1-carboxy-2-mercapto-5-(trimethoxysilyl)pentane, 1-sulfo-2-mercapto-5-(trimethoxysilyl)pentane, 1-carboxy-2-hydroxy-4-(trimethoxysilyl)benzene, 1-sulfo-2-hydroxy-4-(trimethoxysilyl)benzene, 1-mercapto-2-hydroxy-4-(trimethoxysilyl)benzene, as well as positional isomers of these structural units whose substituent groups are in different positions, and in addition, the structural units derived from methyl (thio)esters, ethyl (thio)esters, n-propyl (thio)esters, isopropyl (thio)esters, n-butyl (thio)esters, sec-butyl (thio)esters, t-butyl (thio)esters, methyl (thio)ethers, ethyl (thio)ethers, n-propyl (thio)ethers, isopropyl (thio)ethers, n-butyl (thio)ethers, sec-butyl (thio)ethers, t-butyl (thio)ethers, cyclic (thio)esters, and cyclic (thio)ethers.

Among these structural units, in view of improvement in applicability of the semiconductor solution, and compatibility of both the low hysteresis and the crack resistance of the gate insulating layer, the structural units derived from the silane compounds having at least two carboxy groups or derivatives thereof, or at least one cyclic acid anhydride group are preferable; the structural units derived from the silane compounds having the succinic acid, the succinic acid anhydride structure, or the derivative thereof are more preferable; the structural units derived from the silane compounds having the succinic acid or the succinic acid anhydride structure are still more preferable; 3-[dimethoxy(methyl)silyl]propylsuccinic aid, 3-[diethoxy(methyl)silyl]propylsuccinic acid, 3-[dimethoxy(phenyl)silyl]propylsuccinic acid, 3-[diethoxy(phenyl)silyl]propylsuccinic acid, 3-(trimethoxysilyl)propylsuccinic acid, 3-(triethoxysilyl)propylsuccinic acid, as well as the structural units derived from anhydrides of these acids are even more preferable; and 3-(trimethoxysilyl)propylsuccinic acid, 3-(triethoxysilyl)propylsuccinic acid, as well as the structural units derived from anhydrides of these acids are particularly preferable.

In the present invention, in view of improvement in the crack resistance by introduction of a crosslinking structure, it is preferable that the polysiloxane having the structural unit represented by the general formula (1) further have a structural unit represented by the following general formula (4).

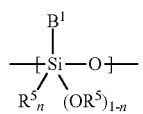
(4)

In the general formula (4), $R^5$ represents a hydrogen atom, an alkyl group, a cycloalkyl group, a heterocyclic group, an aryl group, a hetero-aryl group, or an alkenyl group. $R^6$ represents a hydrogen atom, an alkyl group, a cycloalkyl group, or a silyl group. n represents 0 or 1. $B^1$ represents an organic group including an addition reaction structure formed among an acryl group and/or a methacryl group themselves.

The organic groups including an addition reaction structure formed among an acryl group and/or a methacryl group themselves are formed by addition reaction of the acryl group and/or the methacryl group included in the silane compound having the acryl group and/or the methacryl group, in which the silane compound provides the structural unit represented by the general formula (4), with the acryl group and/or the methacryl group included in a radical polymerizable compound to be described later. The addition reaction is a crosslinking reaction due to a radical polymerization by means of light or heat.

In the polysiloxane having the structural unit represented by the general formula (1), the content ratio of the structural unit represented by the general formula (4) that occupies in the entire silane structural units is, in view of improvement in the crack resistance, preferably 5% by mole or higher, more preferably 15% by mole or higher, while still more preferably 25% by mole or higher. When the density of crosslinking is too high, the film is swelled during a wet process such as development in the photolithography process thereby causing a decrease in the resolution of a pattern. In view of avoiding this, the content ratio thereof is preferably 50% by mole or lower, more preferably 45% by mole or lower, while still more preferably 40% by mole or lower.

Specific structural units represented by the general formula (4) to be used in the present invention are the structural units that are obtained by the addition reaction of the acryl group and/or the methacryl group among themselves of the structural units derived from, as the silane compounds, (3-acryloxypropyl) dimethoxy methyl silane, (3-methacryloxypropyl) dimethoxy methyl silane, (3-acryloxypropyl) diethoxy methyl silane, (3-methacryloxypropyl) diethoxy methyl silane, (3-acryloxypropyl) dimethoxy phenyl silane, (3-methacryloxypropyl) dimethoxy phenyl silane, (3-acryloxypropyl) diethoxy phenyl silane, (3-methacryloxypropyl) diethoxy phenyl silane, (3-acryloxypropyl) trimethoxy silane, (3-methacryloxypropyl) trimethoxy silane, (3-acryloxypropyl) triethoxy silane, (3-methacryloxypropyl) triethoxy silane, (4-acryloxybutyl) dimethoxy methyl silane, (4-methacryloxybutyl) dimethoxy methyl silane, (4-acryloxybutyl) diethoxy methyl silane, (4-methacryloxybutyl) diethoxy methyl silane, (4-acryloxybutyl) dimethoxy phenyl silane, (4-methacryloxybutyl) dimethoxy phenyl silane, (4-acryloxybutyl) diethoxy phenyl silane, (4-methacryloxybutyl) diethoxy phenyl silane, (4-acryloxybutyl) trimethoxy silane, (4-methacryloxybutyl) trimethoxy silane, (4-acryloxybutyl) triethoxy silane, (4-methacryloxybutyl) triethoxy silane, (5-acryloxypentyl) dimethoxy methyl silane, (5-methacryloxypentyl) dimethoxy methyl silane, (5-acryloxypentyl) diethoxy methyl silane, (5-methacryloxypentyl) diethoxy methyl silane, (5-acryloxypentyl) dimethoxy phenyl silane, (5-methacryloxypentyl) dimethoxy phenyl silane, (5-acryloxypentyl) diethoxy phenyl silane, (5-methacryloxypentyl) diethoxy phenyl silane, (5-acryloxypentyl) trimethoxy silane, (5-methacryloxypentyl) trimethoxy silane, (5-acryloxypentyl) triethoxy silane, (5-methacryloxypentyl) triethoxy silane, (6-acryloxyhexyl) dimethoxy methyl silane, (6-methacryloxyhexyl) dimethoxy methyl silane, (6-acryloxyhexyl) diethoxy methyl silane, (6-methacryloxyhexyl) diethoxy methyl silane, (6-acryloxyhexyl) dimethoxy phenyl silane, (6-methacryloxyhexyl) dimethoxy phenyl silane, (6-acryloxyhexyl) diethoxy phenyl silane, (6-methacryloxyhexyl) diethoxy phenyl silane, (6-acryloxyhexyl) trimethoxy silane, (6-methacryloxyhexyl) trimethoxy silane, (6-acryloxyhexyl) triethoxy silane, and (6-methacryloxyhexyl) triethoxy silane.

Among these compounds, in view of reactivity of the addition reaction, preferable are the structural units obtained by the addition reaction of the structure derived from (3-acryloxypropyl) dimethoxy methyl silane, (3-methacryloxypropyl) dimethoxy methyl silane, (3-acryloxypropyl) diethoxy methyl silane, (3-methacryloxypropyl) diethoxy methyl silane, (3-acryloxypropyl) dimethoxy phenyl silane, (3-methacryloxypropyl) dimethoxy phenyl silane, (3-acryloxypropyl) diethoxy phenyl silane, (3-methacryloxypropyl) diethoxy phenyl silane, (3-acryloxypropyl) trimethoxy silane, (3-methacryloxypropyl) trimethoxy silane, (3-acryloxypropyl) triethoxy silane, and (3-methacryloxypropyl) triethoxy silane; and more preferable are the structural units obtained by the addition reaction of the structure derived from (3-acryloxypropyl) trimethoxy silane, (3-methacryloxypropyl) trimethoxy silane, (3-acryloxypropyl) triethoxy silane, and (3-methacryloxypropyl) triethoxy silane.

In the present invention, furthermore, in view of compatibility of both the high insulation property and the high crack resistance, it is preferable that the polysiloxane having the structural unit represented by the general formula (1) be combined with one or more structural unit derived from a silane compound other than the general formulae (1) and (4). The insulation property used in the present invention is an index of difficulty in the flow of electricity, in which the film with the volume resistivity of $10^8$ Ω·cm or higher corresponds to this.

The structural units derived from the following compounds may be specifically mentioned as the silane compounds other than the general formulae (1) and (4), namely, vinyl trimethoxy silane, vinyl triethoxy silane, methyl trimethoxy silane, methyl triethoxy silane, ethyl trimethoxy silane, ethyl triethoxy silane, propyl trimethoxy silane, propyl triethoxy silane, hexyl trimethoxy silane, hexyl triethoxy silane, octadecyl trimethoxy silane, octadecyl triethoxy silane, phenyl trimethoxy silane, phenyl triethoxy silane, p-tolyl trimethoxy silane, p-tolyl triethoxy silane, benzyl trimethoxy silane, benzyl triethoxy silane, α-naphthyl trimethoxy silane, β-naphthyl trimethoxy silane, α-naphthyl triethoxy silane, β-naphthyl triethoxy silane, 3-aminopropyl triethoxy silane, 3-aminopropyl trimethoxy silane, N-(2-aminoethyl)-3-aminopropyl trimethoxy silane, 3-chloropropyl trimethoxy silane, N-(2-aminoethyl)-3-aminopropyl triethoxy silane, 3-chloropropyl triethoxy silane, dimethyl dimethoxy silane, dimethyl diethoxy silane, diphenyl dimethoxy silane, diphenyl diethoxy silane, methyl phenyl dimethoxy silane, methyl vinyl dimethoxy silane, methyl vinyl diethoxy silane, 3-aminopropyl methyl dimethoxy silane, 3-aminopropyl methyl diethoxy silane, N-(2-aminoethyl)-3-aminopropyl methyl dimethoxy silane, N-(2-aminoethyl)-3-aminopropyl methyl diethoxy silane, 3-chloropropyl methyl dimethoxy silane, 3-chloropropyl methyl diethoxy silane, cyclohexyl methyl dimethoxy silane, cyclohexyl methyl diethoxy silane, 3-methacryloxypropyl dimethoxy silane, 3-methacryloxypropyl diethoxy silane, octadecyl methyl dimethoxy silane, octadecyl methyl diethoxy silane, trimethoxy silane, triethoxy silane, tetramethoxy silane, tetraethoxy silane, trifluoroethyl trimethoxy silane, trifluoroethyl triethoxy silane, trifluoroethyl triisopropoxy silane, trifluoropropyl trimethoxy silane, trifluoropropyl triethoxy silane, trifluoropropyl triisopropoxy silane, heptadecafluorodecyl trimethoxy silane, heptadecafluorodecyl triethoxy silane, heptadecafluorodecyl triisopropoxy silane, tridecafluorooctyl triethoxy silane, tridecafluorooctyl trimethoxy silane, tridecafluorooctyl triisopropoxy silane, trifluoroethyl methyl dimethoxy silane, trifluoroethyl methyl diethoxy silane, trifluoroethyl methyl diisopropoxy silane, trifluoropropyl methyl dimethoxy silane, trifluoropropyl methyl diethoxy silane, trifluoropropyl methyl diisopropoxy silane, heptadecafluorodecyl methyl dimethoxy silane, heptadecafluorodecyl methyl diethoxy silane, heptadecafluorodecyl methyl diisopropoxy silane, tridecafluorooctyl methyl dimethoxy silane, tridecafluorooctyl methyl diethoxy silane, tridecafluorooctyl methyl diisopropoxy silane, trifluoroethyl ethyl dimethoxy silane, trifluoroethyl ethyl diethoxy silane, trifluoroethyl ethyl diisopropoxy silane, trifluoropropyl ethyl dimethoxy silane, trifluoropropyl ethyl diethoxy silane, trifluoropropyl ethyl diisopropoxy silane, heptadecafluorodecyl ethyl dimethoxy silane, heptadecafluorodecyl ethyl diethoxy silane, heptadecafluorodecyl ethyl diisopropoxy silane, tridecafluorooctyl ethyl diethoxy silane, tridecafluorooctyl ethyl dimethoxy silane, tridecafluorooctyl ethyl diisopropoxy silane, p-trifluorophenyl triethoxy silane, and p-trifluorophenyl trimethoxy silane.

(Production Method of Polysiloxane)

The polysiloxane having the structural unit represented by the general formula (1) to be used in the present invention can be obtained by the way, for example, as follows. All the silane compounds are dissolved in a solvent; and then, after an acid catalyst and water are added thereto over a period of 1 minute to 180 minutes, a hydrolysis reaction is carried out at the temperature of 15° C. to 80° C. for the period of 1 minute to 180 minutes. The temperature at the time of the hydrolysis reaction is more preferably 15° C. to 55° C. This reaction solution is heated at least 50° C. and up to the boiling point of the solvent for a period of 1 hour to 100 hours to carry out a condensation reaction, so that the polysiloxane having the structural unit represented by the general formula (1) can be obtained.

The conditions of the hydrolysis reaction, such as an acid concentration, the reaction temperature, and the reaction time, are set by considering, among other things, the scale of the reaction and the size and shape of the reactor in order to obtain the physical properties that match a target use.

Illustrative examples of the acid catalyst to be used in the hydrolysis reaction of the silane compound include formic acid, oxalic acid, hydrochloric acid, sulfuric acid, acetic acid, trifluoroacetic acid, phosphoric acid, polyphosphoric acid, a polyvalent carboxylic acid or an acid anhydride thereof, and an ion-exchange resin. A content of the acid catalyst is preferably 0.05 part by mass or larger, and more preferably 0.1 part by mass or larger, relative to 100 parts by mass of the total silane compounds, i.e., the copolymer component of the polysiloxane having the structural unit represented by the general formula (1). In addition, the content is preferably 10 parts by mass or smaller, and more preferably 5 parts by mass or smaller. When the content of the acid catalyst is 0.05 part by mass or larger, the hydrolysis reaction can advance sufficiently well; and when the content is 10 parts by mass or smaller, a rapid reaction can be suppressed.

The solvent to be used in the hydrolysis reaction is preferably an organic solvent. Illustrative examples thereof include alcohols such as ethanol, propanol, butanol, and 3-methyl-3-methoxy-1-butanol; glycols such as ethylene glycol and propylene glycol; ethers such as ethylene glycol monomethyl ether, propylene glycol monomethyl ether, butylene glycol monobutyl ether, and diethyl ether; ketones such as methyl isobutyl ketone and diisobutyl ketone; amides such as dimethylformamide and dimethylacetamide; acetates such as ethyl acetate, ethyl cellosolve acetate, and 3-methyl-3-methoxy-1-butanol acetate; aromatic or aliphatic hydrocarbons such as toluene, xylene, hexane, and cyclohexane; and γ-butyrolactone, N-methyl-2-pyrrolidone, and dimethyl sulfoxide. The amount of the solvent is preferably at least 50 parts by mass and up to 500 parts by mass relative to 100 parts by mass of the total silane compounds, i.e., the copolymer component of the polysiloxane having the structural unit represented by the general formula (1). When the amount thereof is 50 parts by mass or larger, a rapid reaction can be suppressed, and when the amount is 500 parts by mass or smaller, the hydrolysis reaction can advance sufficiently well.

As the water to be used in the hydrolysis reaction, ion-exchanged water is preferable. The amount of the water may be arbitrarily selected. When the silane compound having a hydrolysable structure such as an acid anhydride group or an epoxy group is used, in addition to an equimolar amount of water to the alkoxy group in the silane compound, it is suitable to further add the water equal to or larger than equimolar amounts to the functional groups to be hydrolyzed. In order to increase the degree of polymerization of the polysiloxane, re-heating or addition of a base catalyst may be carried out as well.

That the polysiloxane having the structural unit represented by the general formula (1) includes the structural unit represented by the general formula (1) and/or the general formula (4) can be determined by various organic analysis methods such as an elemental analysis, a nuclear magnetic resonance analysis, and an infrared spectroscopic analysis, singly or as a combination of a plurality of them.

The gate insulating layer according to the present invention may include one, or two or more of the polysiloxane having the structural unit represented by the general formula (1). Alternatively, one or more of the polysiloxane having the structural unit represented by the general formula (1) and one or more of the afore-mentioned silane compounds may be used as a mixture of them.

(Other Components)

In view of lowering the threshold voltage of the FET and the hysteresis, it is preferable that the gate insulating layer in the present invention includes a metal compound including a bond between a metal atom and an oxygen atom. There is no particular restriction in the metal compound so far as the metal compound includes a bond between a metal atom and an oxygen atom, so that a metal oxide, a metal hydroxide, and the like may be exemplified. The metal atom included in the metal compound is not particularly restricted so far as it forms a metal chelate, so that illustrative examples of the metal atom include magnesium, aluminum, titanium, chromium, manganese, cobalt, nickel, copper, zinc, gallium, zirconium, ruthenium, palladium, indium, hafnium, and platinum. Among these, in view of easy availability, a cost, and stability of the metal chelate, aluminum is preferable.

The amount of the metal atom is preferably at least 0.5 part by mass and up to 180 parts by mass relative to the total 100 parts by mass of a carbon atom and a silicon atom of the polysiloxane manly having the structural unit represented by the general formula (1) in the gate insulating layer in the present invention. Within this range, compatibility of both the low threshold voltage of the FET and the low hysteresis can be achieved. More preferably, the metal atom is included at least 1 part by mass and up to 60 parts by mass relative to the total 100 parts by mass of the carbon atom and the silicon atom. Still more preferably, the metal atom is included at least 2 parts by mass and up to 30 parts by mass relative to the total 100 parts by mass of the carbon atom and the silicon atom. Within this range, the effect to lower the threshold voltage and the hysteresis can be enhanced furthermore.

The mass ratio of the metal atom relative to the total 100 parts by mass of the carbon atom and the silicon atom of the polysiloxane mainly having the structural unit represented by the general formula (1) in the gate insulating layer may be determined by an X-ray photoelectron spectroscopy (XPS).

Note that the relationship of the content ratio of the atoms (carbon atom, silicon atom, and metal atom) in the gate insulating layer indicates a rough tendency; and thus, the above-mentioned relationship is not always satisfied depending on, for example, the metal atoms.

The gate insulating layer in the present invention may further include an addition reactant of a radial polymerizable compound as a photosensitive organic component.

The radical polymerizable compound means a compound having plural ethylenic unsaturated double bond groups in its molecule. By irradiation with UV light, a radical polymerization of the radical polymerizable compound takes place by means of a radical that is generated from a photopolymerization initiator to be described later thereby leading to an increase in the crosslinking density of the gate insulating layer so that the hardness thereof can be enhanced.

The radical polymerizable compound is preferably a compound having a (meth)acryl group, which can readily undergo the radical polymerization. In view of enhancement of the sensitivity at the time of irradiation with UV light as well as enhancement of the hardness of the gate insulating layer, a compound having two or more of the (meth)acryl group in its molecule is more preferable.

Illustrative examples of the radical polymerizable group include diethylene glycol di(meth)acrylate, triethylene glycol di(meth)acrylate, tetraethylene glycol di(meth)acrylate, propylene glycol di(meth)acrylate, trimethylolpropane di(meth)acrylate, trimethylolpropane tri(meth)acrylate, ethoxylated trimethylolpropane di(meth)acrylate, ethoxylated trimethylolpropane tri(meth)acrylate, ditrimethylolpropane tri(meth)acrylate, ditrimethylolpropane tetra(meth)acrylate, 1,3-butanediol di(meth)acrylate, neopentyl glycol di(meth)acrylate, 1,4-butanediol di(meth)acrylate, 1,6-hexanediol di(meth)acrylate, 1,9-nonanediol di(meth)acrylate, 1,10-decanediol di(meth)acrylate, dimethylol-tricyclodecane di(meth)acrylate, ethoxylated glycerin tri(meth)acrylate, pentaerythritol tri(meth)acrylate, pentaerythritol tetra(meth)acrylate, ethoxylated pentaerythritol tri(meth)acrylate, ethoxylated pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, tetrapentaerythritol nona(meth)acrylate, tetrapentaerythritol deca(meth)acrylate, pentapentaerythritol undeca(meth)acrylate, pentapentaerythritol dodeca(meth)acrylate, ethoxylated bisphenol A di(meth)acrylate, 2,2-bis[4-(3-(meth)acryloxy-2-hydroxypropoxy)phenyl]propane, 1,3,5-tris((meth)acryloxyethyl)isocyanuric acid, 1,3-bis((meth)acryloxyethyl)isocyanuric acid, 9,9-bis[4-(2-(meth)acryloxyethoxy)phenyl]fluorene, 9,9-bis[4-(3-(meth)acryloxypropoxy)phenyl]fluorene, 9,9-bis[4-(meth)acryloxyphenyl)fluorene, as well as their acid-modified compounds, ethylene oxide-modified compounds, and propylene oxide-modified compounds. In view of enhancement of the sensitivity at the time of irradiation with UV light and enhancement of the hardness of the cured film, the following compounds are preferable: trimethylolpropane tri(meth)acrylate, ditrimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, 2,2-bis[4-(3-(meth)acryloxy-2-hydroxypropoxy)phenyl]propane, 1,3,5-tris((meth)acryloxyethyl)isocyanuric acid, 1,3-bis((meth)acryloxyethyl)isocyanuric acid, 9,9-bis[4-(2-(meth)acryloxyethoxy)phenyl]fluorene, 9,9-bis[4-(3-(meth)acryloxypropoxy)phenyl]fluorene, 9,9-bis[4-(meth)acryloxyphenyl)fluorene, as well as their acid-modified compounds, ethylene oxide-modified compounds, and propylene oxide-modified compounds.

The gate insulating layer in the present invention may further include, as the photosensitive organic component, a compound that can generate a radical by a bond breakage and/or a reaction when UV light is applied (hereinafter, this compound is called "photopolymerization initiator").

When the photopolymerization initiator is included therein, the radical polymerization of the radical polymerizable compound can take place, and the addition reaction at the time of irradiation with UV light can be facilitated.

Preferable examples of the photopolymerization initiator include a benzyl ketal photopolymerization initiator, an α-hydroxyketone photopolymerization initiator, an α-aminoketone photopolymerization initiator, an acylphosphine oxide photopolymerization initiator, an oxime ester photopolymerization initiator, an acridine photopolymerization initiator, a titanocene photopolymerization initiator, a benzophenone photopolymerization initiator, an acetophenone photopolymerization initiator, an aromatic ketoester photopolymerization initiator, and a benzoate ester photopolymerization initiator. In view of enhancement of the sensitivity at the time of irradiation with UV light, an α-hydroxyketone photopolymerization initiator, an α-aminoketone photopolymerization initiator, an acylphosphine oxide photopolymerization initiator, an oxime ester photopolymerization initiator, an acridine photopolymerization initiator, and a benzophenone photopolymerization initiator are more preferable, while an α-aminoketone photopolymerization initiator, an acylphosphine oxide photopolymerization initiator, and an oxime ester photopolymerization initiator are still more preferable.

Illustrative examples of the benzyl ketal photopolymerization initiator include 2,2-dimethoxy-1,2-diphenylethan-1-one.

Illustrative examples of the α-hydroxyketone photopolymerization initiator include 1-(4-isopropylphenyl)-2-hydroxy-2-methylpropan-1-one, 2-hydroxy-2-methyl-1-phenylpropan-1-one, 1-hydroxycyclohexyl phenyl ketone, 1-[4-(2-hydroxyethoxy)phenyl]-2-hydroxy-2-methylpropan-1-one, and 2-hydroxy-1-[4-[4-(2-hydroxy-2-methylpropionyl)benzyl]phenyl]-2-methylpropan-1-one.

Illustrative examples of the α-aminoketone photopolymerization initiator include 2-methyl-1-[4-(methylthio)phenyl]-2-morpholinopropan-1-one, 2-benzyl-2-dimethylamino-1-(4-morpholinophenyl)-butan-1-one, 2-dimethylamino-2-(4-methylbenzyl)-1-(4-morpholinophenyl)-butan-1-one, and 3,6-bis(2-methyl-2-morpholinopropionyl)-9-octyl-9H-carbazole.

Illustrative examples of the acylphosphine oxide photopolymerization initiator include 2,4,6-trimethylbenzoyl-diphenylphosphine oxide, bis(2,4,6-trimethylbenzoyl)-phenylphosphine oxide, and bis(2,6-dimethoxybenzoyl)-(2,4,4-trimethylpentyl)phosphine oxide.

Illustrative examples of the oxime ester photopolymerization initiator include 1-phenylpropane-1,2-dione-2-(O-ethoxycarbonyl) oxime, 1-phenylbutane-1,2-dione-2-(O-ethoxycarbonyl) oxime, 1,3-diphenylpropane-1,2,3-trione-2-(O-ethoxycarbonyl) oxime, 1-[4-(phenylthio)phenyl]octane-1,2-dione-2-(O-benzoyl) oxime, 1-[4-[4-(carboxyphenyl)thio]phenyl]propane-1,2-dione-2-(O-acetyl) oxime, 1-[9-ethyl-6-(2-methylbenzoyl)-9H-carbazol-3-yl]ethanone-1-(O-acetyl) oxime, 1-[9-ethyl-6-[2-methyl-4-[1-(2,2-dimethyl-1,3-dioxolan-4-yl)methyloxy]benzoyl]-9H-carbazol-3-yl]ethanone-1-(O-acetyl) oxime, and 1-(9-ethyl-6-nitro-9H-carbazol-3-yl)-1-[2-methyl-4-(1-methoxypropan-2-yloxy)phenyl]methanone-1-(O-acetyl) oxime.

Illustrative examples of the acridine photopolymerization initiator include 1,7-bis(acridin-9-yl)-n-heptane.

Illustrative examples of the titanocene photopolymerization initiator include bis($\eta^5$-2,4-cyclopentadien-1-yl)-bis[2,6-difluoro-3-(1H-pyrrol-1-yl)phenyl] titanium (IV) and bis($\eta^5$-3-methyl-2,4-cyclopentadien-1-yl)-bis(2,6-difluorophenyl) titanium (IV).

Illustrative examples of the benzophenone photopolymerization initiator include benzophenone, 4,4'-bis(dimethylamino)benzophenone, 4,4'-bis(diethylamino)benzophenone, 4-phenylbenzophenone, 4,4'-dichlorobenzophenone, 4-hydroxybenzophenone, an alkylated benzophenone, 3,3',4,4'-tetrakis(t-butylperoxycarbonyl)benzophenone, 4-methylbenzophenone, dibenzyl ketone, and fluorenone.

Illustrative examples of the acetophenone photopolymerization initiator include 2,2-diethoxy acetophenone, 2,3-diethoxy acetophenone, 4-t-butyl dichloro acetophenone, benzal acetophenone, and 4-azidobenzal acetophenone.

Illustrative examples of the aromatic ketoester photopolymerization initiator include methyl 2-phenyl-2-oxyacetate.

Illustrative examples of the benzoate ester photopolymerization initiator include ethyl 4-dimethylaminobenzoate, (2-ethyl)hexyl 4-dimethylaminobenzoate, ethyl 4-diethylaminobenzoate, and methyl 2-benzoylbenzoate.

The gate insulating layer in the present invention may further include, as the photosensitive organic component, a compound that generates an acid by light (hereinafter, this is called "photoacid generator"). Illustrative examples of the photoacid generator include an onium salt compound, a halogen-containing compound, a diazoketone compound, a diazomethane compound, a sulfone compound, a sulfonate ester compound, and a sulfoimide compound.

Specific examples of the onium salt compound to be used as the photoacid generator include a diazonium salt, an ammonium salt, an iodonium salt, a sulfonium salt, a phosphonium salt, and an oxonium salt. Preferable examples of the onium salt include diphenyliodonium triflate, diphenyliodonium pyrenesulfonate, diphenyliodonium dodecylbenzenesulfonate, triphenylsulfonium triflate (trade name of "TPS-105", manufactured by Midori Kagaku Co., Ltd.), 4-t-butylphenyldiphenylsulfonium triflate (trade name of "WPAG-339", manufactured by Wako Pure Chemical Corp.), 4-methoxyphenyldiphenylsulfonium triflate (trade name of "WPAG-370", manufactured by Wako Pure Chemical Corp.), triphenylsulfonium nonaflate (trade name of "TPS-109", manufactured by Midori Kagaku Co., Ltd.), triphenylsulfonium hexafluoroantimonate, triphenylsulfonium naphthalenesulfonate, and (hydroxyphenyl)benzylmethylsulfonium toluenesulfonate.

Specific examples of the halogen-containing compound to be used as the photoacid generator include a hydrocarbon compound having a haloalkyl group and a heterocyclic compound having a haloalkyl group. Preferable examples of the halogen-containing compound include 1,1-bis(4-chlorophenyl)-2,2,2-trichloroethane, 2-phenyl-4,6-bis(trichloromethyl)-s-triazine, and 2-naphthyl-4,6-bis(trichloromethyl)-s-triazine.

Specific examples of the diazoketone compound to be used as the photoacid generator include a 1,3-diketo-2-diazo compound, a diazo benzoquinone compound, and a diazo naphthoquinone compound. Among these compounds, in view of the patterning accuracy and the crack resistance of the gate insulating layer to be obtained, a diazo naphthoquinone compound is preferable. Preferable examples of the diazoketone compound include the ester of 1,2-naphthoquinonediazide-4-sulfonic acid with 2,2,3,4,4'-pentahydroxybenzophenone and the ester of 1,2-naphthoquinonediazide-4-sulfonic acid with 1,1,1-tris(4-hydroxyphenyl)ethane.

Specific examples of the diazomethane compound to be used as the photoacid generator include bis(trifluoromethylsulfonyl) diazomethane, bis(cyclohexylsulfonyl) diazomethane, bis(phenylsulfonyl) diazomethane, bis(p-tolylsulfonyl) diazomethane, bis(2,4-xylylsulfonyl) diazomethane, bis(p-chlorophenylsulfonyl) diazomethane, methylsulfonyl-p-toluenesulfonyl diazomethane, cyclohexylsulfonyl(1,1-dimethylethylsulfonyl) diazomethane, bis(1,1-dimethylethylsulfonyl) diazomethane, and phenylsulfonyl (benzoyl) diazomethane.

Specific examples of the sulfone compound to be used as the photoacid generator include a β-keto sulfone compound and a β-sulfonyl sulfone compound. Preferable examples of the sulfone compound include 4-trisphenacyl sulfone, mesityl phenacyl sulfone, and bis(phenylsulfonyl)methane.

Illustrative examples of the sulfonate ester compound to be used as the photoacid generator include an alkyl sulfonate ester, a haloalkyl sulfonate ester, an aryl sulfonate ester, and an iminosulfonate. Specific examples thereof include benzoin tosylate, pyrogallol trimesylate, and nitrobenzyl-9,10-diethoxyanthracene-2-sulfonate.

Specific examples of the sulfone imide compound to be used as the photoacid generator include N-(trifluoromethylsulfonyloxy) succinimide, N-(trifluoromethylsulfonyloxy) phthalimide, N-(trifluoromethylsulfonyloxy) diphenyl maleimide, N-(trifluoromethylsulfonyloxy)bicyclo[2.2.1]hept-5-ene-2,3-dicarboxyimide, N-(trifluoromethylsulfonyloxy)-7-oxabicyclo[2.2.1]hept-5-ene-2,3-dicarboxyimide, N-(trifluoromethylsulfonyloxy)bicyclo[2.2.1]heptane-5,6-oxy-2,3-dicarboxyimide, N-(trifluoromethylsulfonyloxy) naphthyl dicarboxyimide, N-(camphorsulfonyloxy) succinimide, N-(camphorsulfonyloxy) phthalimide, N-(camphorsulfonyloxy) diphenyl maleimide, N-(camphorsulfonyloxy) bicyclo[2.2.1]hept-5-ene-2,3-dicarboxyimide, N-(camphorsulfonyloxy)-7-oxabicyclo[2.2.1]hept-5-ene-2,3-dicarboxyimide, N-(camphorsulfonyloxy)bicyclo[2.2.1]heptane-5,6-oxy-2,3-dicarboxyimide, N-(camphorsulfonyloxy) naphthyl dicarboxyimide, N-(4-methylphenylsulfonyloxy) succinimide, N-(4-methylphenylsulfonyloxy) phthalimide, N-(4-methylphenylsulfonyloxy) diphenyl maleimide, N-(4-methylphenylsulfonyloxy)bicyclo[2.2.1]hept-5-ene-2,3-dicarboxyimide, N-(4-methylphenylsulfonyloxy)-7-oxabicyclo[2.2.1]hept-5-ene-2,3-dicarboxyimide, N-(4-methylphenylsulfonyloxy)bicyclo[2.2.1]heptane-5,6-oxy-2,3-dicarboxyimide, N-(4-methylphenylsulfonyloxy) naphthyl dicarboxyimide, N-(2-trifluoromethylphenylsulfonyloxy) succinimide, N-(2-trifluoromethylphenylsulfonyloxy) phthalimide, N-(2-trifluoromethylphenylsulfonyloxy) diphenyl maleimide, N-(2-trifluoromethylphenylsulfonyloxy)bicyclo[2.2.1]hept-5-ene-2,3-dicarboxyimide, N-(2-trifluoromethylphenylsulfonyloxy)-7-oxabicyclo[2.2.1]hept-5-ene-2,3-dicarboxyimide, N-(2-trifluoromethylphenylsulfonyloxy)bicyclo[2.2.1]heptane-5,6-oxy-2,3-dicarboxyimide, N-(2-trifluoromethylphenylsulfonyloxy) naphthyl dicarboxyimide, N-(4-fluorophenylsulfonyloxy) succinimide, N-(2-fluorophenylsulfonyloxy) phthalimide, N-(4-fluorophenylsulfonyloxy) diphenyl maleimide, N-(4-fluorophenylsulfonyloxy)bicyclo[2.2.1]hept-5-ene-2,3-dicarboxyimide, N-(4-fluorophenylsulfonyloxy)-7-oxabicyclo[2.2.1]hept-5-ene-2,3-dicarboxyimide, N-(4-fluorophenylsulfonyloxy)bicyclo[2.2.1]heptane-5,6-oxy-2,3-dicarboxyimide, and N-(4-fluorophenylsulfonyloxy) naphthyl dicarboxyimide.

In addition to the above-mentioned compounds, illustrative examples of the photoacid generator include 5-norbornene-2,3-dicarboxyimidyl triflate (trade name of "NDI-105", manufactured by Midori Kagaku Co., Ltd.), 5-norbornene-2,3-dicarboxyimidyl tosylate (trade name of "NDI-101", manufactured by Midori Kagaku Co., Ltd.), 4-methylphenylsulfonyloxyimino-α-(4-methoxyphenyl) acetonitrile (trade name of "PAI-101", manufactured by Midori Kagaku Co., Ltd.), trifluoromethylsulfonyloxyimino-α-(4-methoxyphenyl) acetonitrile (trade name of "PAI-105", manufactured by Midori Kagaku Co., Ltd.), 9-camphorsulfonyloxyimino-α-(4-methoxyphenyl) acetonitrile (trade name of "PAI-106", manufactured by Midori Kagaku Co., Ltd.), 1,8-naphthalimidyl butanesulfonate (trade name of "NAI-1004", manufactured by Midori Kagaku Co., Ltd.), 1,8-naphthalimidyl tosylate (trade name of "NAI-101", manufactured by Midori Kagaku Co., Ltd.), 1,8-naphthalimidyl triflate (trade name of "NAI-105", manufactured by Midori Kagaku Co., Ltd.), 1,8-naphthalimidyl nonafluorobutanesulfonate (trade name of "NAI-109", manufactured by Midori Kagaku Co., Ltd.), diphenyl (4-methoxyphenyl)sulfonium trifluoromethanesulfonate (trade name of "WPAG-370", manufactured by Wako Pure Chemical Corp.), trade name of "WPAG-339" (manufactured by Wako Pure Chemical Corp.), trade name of "TPS-105" and trade name of "TPS-109" (manufactured by Midori Kagaku Co., Ltd.), and diphenyliodonium pyrenesulfonate. Among these compounds, TPS-105, WPAG-339, WPAG-370, TPS-109, diphenyliodonium pyrenesulfonate, NDI-105, PAI-101, and NAI-105 are especially preferable.

Furthermore, it is preferable that the photopolymerization initiator and the photoacid generator be used in a combination with a sensitizer, which is a photosensitive organic component. The sensitizer is not colored by a photofading reaction so that a high sensitivity can be obtained even in the gate insulating layer while keeping a high transparency. There is no particular restriction in the sensitizer so that any heretofore known material may be used; though a 9,10-disubstituted anthracene compound is especially preferable.

Illustrative examples of the 9,10-disubstituted anthracene compound include 9,10-diphenyl anthracene, 9,10-bis(4-methoxyphenyl) anthracene, 9,10-bis(triphenylsilyl) anthracene, 9,10-dimethoxy anthracene, 9,10-diethoxy anthracene, 9,10-dipropoxy anthracene, 9,10-dibutoxy anthracene, 9,10-dipentyloxy anthracene, 2-t-butyl-9,10-dibutoxy anthracene, and 9,10-bis(trimethylsilylethynyl) anthracene. Among these compounds, 9,10-dimethoxy anthracene, 9,10-diethoxy anthracene, 9,10-dipropoxy anthracene, and 9,10-dibutoxy anthracene are especially preferable.

The gate insulating layer in the present invention may further include an addition reactant of a chain transfer agent as the photosensitive organic component.

The chain transfer agent is a compound that can receive a radical from a growing polymer terminal in the polymer chain obtained by radical polymerization at the time of irradiation with UV light, and then mediate the radical transfer to other polymer chain.

By including the chain transfer agent, the sensitivity at the time of irradiation with UV light can be enhanced. It is presumed that this occurs because the radical generated by irradiation with UV light migrates to other polymer chain by the chain transfer agent thereby causing radical crosslinking to a very deep part in the film.

As the chain transfer agent, a thiol chain transfer agent is preferable. Illustrative examples thereof include β-mercaptopropionic acid, methyl β-mercaptopropionate, ethyl β-mercaptopropionate, 2-ethylhexyl β-mercaptopropionate, n-octyl β-mercaptopropionate, methoxybutyl β-mercaptopropionate, stearyl β-mercaptopropionate, isononyl β-mercaptopropionate, β-mercaptobutanoic acid, methyl β-mercaptobutanoate, ethyl β-mercaptobutanoate, 2-ethylhexyl β-mercaptobutanoate, n-octyl β-mercaptobutanoate, methoxybutyl β-mercaptobutanoate, stearyl β-mercaptobutanoate, isononyl β-mercaptobutanoate, methyl thioglycolate, n-octyl thioglycolate, methoxybutyl thioglycolate, 1,4-bis(3-mercaptobutanoyloxy)butane, 1,4-bis(3-mercaptopropionyloxy)butane, 1,4-bis(thioglycoloyloxy)butane, ethylene glycol bis(thioglycolate), trimethylolethane tris(3-mercaptopropionate), trimethylolethane tris(3-mercaptobutylate), trimethylolpropane tris(3-mercaptopropionate), trimethylolpropane tris(3-mercaptobutyrate), trimethylolpropane tris(thioglycolate), 1,3,5-tris[3-mercaptopropionyloxy]ethyl]isocyanuric acid, 1,3,5-tris[3-mercaptobutanoyloxy]ethyl]isocyanuric acid, pentaerythritol tetrakis(3-mercaptopropionate), pentaerythritol tetrakis(3-mercaptobutyrate), pentaerythritol tetrakis (thioglycolate), dipentaerythritol hexakis(3-mercaptopropionate), and dipentaerythritol hexakis(3-mercaptobutyrate).

Furthermore, the gate insulating layer in the present invention may include a polymerization inhibitor as the photosensitive organic component.

The polymerization inhibitor is the compound that captures a radical generated at the time of irradiation with UV light or a radical at a growing polymer terminal of the polymer chain formed by a radical polymerization at the time of irradiation with UV light thereby keeping it as a stable radical so that the radical polymerization can be terminated.

By including an appropriate amount of the polymerization inhibitor, an excess amount of radicals that are generated at the time of irradiation with UV light can be suppressed so that the radical polymerization can be controlled.

As the polymerization inhibitor, a phenolic polymerization inhibitor is preferable. Illustrative examples of the phenolic polymerization inhibitor include 4-methoxyphenol, 1,4-hydroquinone, 1,4-benzoquinone, 2-t-butyl-4-methoxyphenol, 3-t-butyl-4-methoxyphenol, 4-t-butylcatechol, 2,6-di-t-butyl-4-methylphenol, 2,5-di-t-butyl-1,4-hydroquinone, 2,5-di-t-amyl-1,4-hydroquinone, as well as "IRGANOX" (registered trade mark) 1010, "IRGANOX" (registered trade mark) 1035, "IRGANOX" (registered trade mark) 1076, "IRGANOX" (registered trade mark) 1098, "IRGANOX" (registered trade mark) 1135, "IRGANOX" (registered trade mark) 1330, "IRGANOX" (registered trade mark) 1726, "IRGANOX" (registered trade mark) 1425, "IRGANOX" (registered trade mark) 1520, "IRGANOX" (registered trade mark) 245, "IRGANOX" (registered trade mark) 259, "IRGANOX" (registered trade mark) 3114, "IRGANOX" (registered trade mark) 565, and "IRGANOX" (registered trade mark) 295 (all of these are manufactured by BASF Japan, Inc.).

The gate insulating layer in the present invention may further include particles. In view of a flatness of the gate insulating layer, the particle diameter of the particle is preferably 100 nm or smaller, and more preferably 50 nm or smaller. The particle diameter is an average particle diameter as a number average, in which the average particle diameter is obtained from a measured specific surface area of the particle obtained after being dried and fired, with the assumption that the particle is a sphere. There is no particular restriction in the instrument to be used for the measurement, so that ASAP 2020 (manufactured by Micromeritics Instrument Corp.) or the like may be used. Specific examples of the particle include the silica particle, the titania particle, the barium titanate particle, the zirconia particle, and the barium sulfate particle.

The gate insulating layer in the present invention may include, as needed, a viscosity adjusting material, a surfactant, a stabilizer, or the like. It does not matter even if the gate insulating layer includes a residual solvent.

Illustrative examples of the surfactant include a fluorine-based surfactant, a silicone-based surfactant, a polyalkyleneoxide-based surfactant, and an acryl-based surfactant.

Specific examples of the fluorine-based surfactant include Megafac F142D, Megafac F172, Megafac F173, and Megafac F183 (all of these surfactants are manufactured by DIC Corp.), as well as NBX-15, FTX-218, and DFX-18 (all of these surfactants are manufactured by NEOS Company Ltd.). Illustrative examples of the silicone-based surfactant include BYK-333 (manufactured by BYK Japan K. K.).

Film thickness of the gate insulating layer in the present invention is preferably at least 0.01 μm and up to 5 μm, and more preferably at least 0.05 μm and up to 1 μm. When the film thickness is within this range, a uniform thin film can be readily formed; and in addition, the current that cannot be controlled by the gate voltage and that is the current between the source and the drain can be suppressed so that the on/off ratio of the FET can be further increased. The film thickness can be obtained from the arithmetic average of the values measured with a spectroscopic reflectometer at 10 different points or more in the plane on the substrate.

In the gate insulating layer in the present invention, the relative dielectric constant is preferably at least 3 and up to 100. The larger the relative dielectric constant is, the lower the threshold voltage of the FET can be.

In the gate insulating layer in the present invention, it is preferable that concentrations of an alkali metal, an alkaline earth metal, and a halogen ion be low. Specifically, concentration of any one of a heavy metal and a halogen ion is preferably 100 ppm or lower, more preferably 1 ppm or lower, while still more preferably 0.1 ppm or lower, in the whole region of the gate insulating layer.

The gate insulating layer in the present invention is composed of a single layer, or plural layers. In the case of plural layers, the plural gate insulating layers in the present invention may be laminated, or the gate insulating layer in the present invention may be laminated with a heretofore known gate insulating layer.

Between the gate insulating layer and the semiconductor layer to be described later, an orientated layer may be disposed. In the orientated layer, a heretofore known material such as a silane compound, a titanium compound, an organic acid, and a hetero organic acid may be used, while an organic silane compound is especially preferable.

<Second Insulating Layer>

The FET according to the embodiment of the present invention may have a second insulating layer to the semiconductor layer to be described later in the side opposite to the gate insulating layer. Note here that "to the semiconductor layer in the side opposite to the gate insulating layer" means, for example, when the gate insulating layer is disposed on the upper side of the semiconductor layer, the lower side of the semiconductor layer. By so doing, the threshold voltage and the hysteresis can be lowered so that the high performance FET can be obtained. The material to be used in the second insulating layer is not particularly restricted, in which specific examples thereof include inorganic materials such as silicon oxide and alumina, and polymer materials such as polyimides and derivatives thereof, polyvinyl alcohol, polyvinyl chloride, polyethylene terephthalate, polyvinylidene fluoride, polysiloxane and derivatives thereof, and polyvinyl phenol and derivatives thereof, as well as a mixture of powder of an inorganic material with the polymer material, and a mixture of an organic low-molecular weight material with the polymer material. The insulating layer including the polysiloxane also includes the gate insulating layer in the present invention. Among these materials, the polymer material that can be applied by means of an inkjet method or the like is preferable. Especially polyfluoroethylene, polynorbornene, polysiloxane, polyimide, polystyrene, polycarbonate or derivatives thereof, polyacrylic acid derivatives, polymethacrylic acid derivatives, or copolymers including these materials are preferable because when they are used, the effects to lower the threshold voltage and the hysteresis can be enhanced, in which polyacrylate derivatives, polymethacrylate derivatives, or a copolymer including these derivatives are especially preferable.

Film thickness of the second insulating layer is generally in the range of 50 nm to 10 µm, and preferably in the range of 100 nm to 3 µm. The second insulating layer may be a single layer or plural layers. One layer may be formed by plural insulating materials, or by laminating plural insulating materials.

The formation method of the second insulating layer is not particularly restricted. Therefore, dry methods such as a resistance heating evaporation method, an electron beam evaporation method, a sputtering method, and a CVD method may be used; but in view of a production cost and applicability to a large area, an application method is preferable. Illustrative examples of the application method include heretofore known application methods such as a spin coating method, a blade coating method, a slit die coating method, a screen printing method, a bar coating method, a casting method, a transfer printing method, an immersion and withdrawal method, and an inkjet method.

<Semiconductor Layer>

The material that can be used in the semiconductor layer is an organic semiconductor and/or a carbon material. Among them, materials having high carrier mobility are preferably used, in which the material that can be applied with an application method, which is a low cost and convenient, is preferable.

Specific examples of the organic semiconductor include: polythiophenes such as poly-3-hexylthiophene and polybenzothiophene; compounds including in its main chain the thiophene units such as poly(2,5-bis(2-thienyl)-3,6-dipentadecylthieno[3,2-b]thiophene), poly(4,8-dihexyl-2,6-bis(3-hexylthiophen-2-yl)benzo[1,2-b:4,5-b']dithiophene), poly(4-octyl-2-(3-octylthiophen-2-yl)thiazole), and poly(5,5'-bis(4-octylthiazol-2-yl)-2,2'-bithiopnene); polypyrroles; poly(p-phenylene vinylene) such as poly(p-phenylene vinylene); polyanilines; polyacetylenes, polydiacetylenes, polycarbazoles; polyfurans such as polyfuran and polybenzofuran; polyheteroaryls having constituent units of a nitrogen-containing aromatic ring such as pyridine, quinoline, phenanthroline, oxazole, and oxadiazole; condensed polycyclic aromatic compounds such as anthracene, pyrene, naphthacene, pentacene, hexacene, and rubrene; heteroaromatic compounds such as furan, thiophene, benzothiophene, dibenzofuran, pyridine, quinoline, phenanthroline, oxazole, and oxadiazole; aromatic amine derivatives represented by 4,4'-bis(N-(3-methylphenyl)-N-phenylamino)biphenyl; bis-carbazole derivatives such as bis(N-allylcarbazole) and bis(N-alkylcarbazole); pyrazoline derivatives; stilbene compounds; hydrazone compounds; metal phthalocyanines such as copper phthalocyanine; metal porphyrins such as copper porphyrin; distyrylbenzene derivatives; aminostyryl derivatives; aromatic acetylene derivatives; condensed ring tetracarboxylic acid diimides such as naphthalene-1,4,5,8-tetracarboxylate diimide and perylene-3,4,9,10-tetracarboxylic acid diimide; and organic dyes such as merocyanine, phenoxazine, and rhodamine. These may be included as a mixture of two or more of them.

Illustrative example of the carbon material include a carbon nanotube (CNT), graphene, and fullerene, in which in view of applicability to the application process and low hysteresis, the CNT is preferable.

As the CNT, any of a single-walled CNT in which a sheet of a carbon film (graphene sheet) is cylindrically rolled, a double-walled CNT in which two sheets of the graphene film are concentrically rolled, and a multiple-walled CNT in which plural sheets of the graphene film are concentrically rolled may be used, in which a combination of two or more of them may also be used. In view of exhibiting the characteristics of the semiconductor, it is preferable to use the single-walled CNT. In particular, the single-walled CNT including 90% by mass or larger of a highly semiconductor enriched single-walled CNT is more preferable. The single-walled CNT including 95% by mass or larger of the highly semiconductor enriched single-walled CNT is still more preferable.

The content ratio of the highly semiconductor enriched single-walled CNT may be calculated from the absorption area ratio of a visible to near infrared absorption spectrum. The CNT may be obtained by the method such as an arc-discharge method, a chemical vapor deposition method (CVD method), or a laser abrasion method.

A CNT composite having at least part of the CNT surface attached with a conjugated polymer is especially preferable because it has superior dispersion stability in a solution and can give a low hysteresis.

The state that a conjugated polymer is attached to at least part of the CNT surface means the state that the conjugated polymer covers a part or entire of the CNT surface. It is presumed that the conjugated polymer can cover the CNT because the π electron clouds derived from each of the conjugated structures are overlapped thereby generating an interaction with each other. Whether the CNT is covered with the conjugated polymer may be determined by whether the reflected color of the covered CNT approaches from the color of the uncovered CNT to the color of the conjugated polymer. Quantitatively, the presence of the attached material and the mass ratio of the attached material to the CNT may be identified by an elemental analysis, an X-ray photoelectron spectroscopy, and the like. The conjugated polymer to be attached to the CNT may be used regardless of the molecular weight, the molecular weight distribution, and the structure thereof.

Illustrative examples of the method to attach the conjugated polymer to the CNT include: (I) the method that the CNT is added to the molten conjugated polymer followed by mixing them; (II) the method that the CNT is added to a solution of the conjugated polymer dissolved in a solvent followed by mixing them; (III) the method that the conjugated polymer is added to the CNT dispersion solution previously dispersed in a solvent by means of ultrasonic waves or the like followed by mixing them; and (IV) the method that the conjugated polymer and the CNT are poured into a solvent followed by mixing the resulting mixed system by irradiating ultrasonic waves. In the present invention, these methods may be combined.

In the present invention, the length of the CNT is preferably shorter than the distance (channel length) between the source electrode and the drain electrode. The average length of the CNT is preferably 2 μm or shorter, and more preferably 0.5 μm or shorter, though different depending on the channel length. There is a distribution in the length of the CNT generally commercially available so that the CNT longer than the channel length can be included therein; and thus, it is preferable to add the process in which the length of the CNT is shorter than the channel length. A cutting method so as to make the CNT to a short fiber, such as an acid treatment with nitric acid or sulfuric acid, or an ultrasonic treatment, or a freeze grinding method, is effective. Separation by means of a filter used concurrently is more preferable in view of increasing the purity thereof.

Diameter of the CNT is not particularly restricted, though the diameter is preferably at least 1 nm and up to 100 nm, and more preferably 50 nm or smaller.

In the present invention, it is preferable to have a process in which the CNT is uniformly dispersed in a solvent, and then, the dispersion solution is filtrated through a filter. By collecting from the filtrate the CNT whose size is smaller than a filter pore diameter, the CNT whose length is shorter than the channel length can be efficiently obtained. In this case, a membrane filter is preferably used as the filter. The pore diameter of the filter to be used in the filtration may be any length so far as this is shorter than the channel length; and thus, it is preferably in the range of 0.5 μm to 10 μm.

Illustrative examples of the conjugated polymer to cover the CNT include a polythiophene type polymer, a polypyrrole type polymer, a polyaniline type polymer, a polyacetylene type polymer, a poly-p-phenylene type polymer, a poly-p-phenylene vinylene type polymer, and a thiophene-heteroarylene type polymer having a thiophene unit and a heteroaryl unit in the repeating unit thereof. These may also be used as a mixture of two or more of them. The polymers that can be used herein may be those in which the same monomer units are arranged, those in which different monomer units are block-copolymerized, randomly copolymerized, or graft-polymerized, or the like.

For the semiconductor layer, the CNT composite and the organic semiconductor may be mixed and used. When the CNT composite is uniformly dispersed in the organic semiconductor, the low hysteresis can be realized with keeping the inherent characteristics of the organic semiconductor.

A content of the CNT composite in the semiconductor layer including the CNT composite and the organic semiconductor is preferably at least 0.01 part by mass and up to 3 parts by mass, and more preferably 1 part by mass smaller, relative to 100 parts by mass of the organic semiconductor.

The semiconductor layer may further include an insulating material. Illustrative examples of the insulating material to be used herein include polymer materials such as poly (methyl methacrylate), polycarbonate, and polyethylene terephthalate, though not particularly limited to these.

The semiconductor layer may be any of single layer and multiple layers. The film thickness thereof is preferably at least 1 nm and up to 200 nm, and more preferably 100 nm or smaller. When the film thickness is within this range, a uniform thin film can be readily formed; and in addition, the current that cannot be controlled by the gate voltage and that is the current between the source and the drain can be controlled, and the on/off ratio of the FET can be increased. The film thickness may be measured with an atomic force microscope, an ellipsometric method, or the like.

<Substrate>

As the material to be used as the substrate, any material may be used so far as at least the surface thereof to which the electrode system is disposed has an insulating property. Illustrative examples thereof to be preferably used include inorganic materials such as a silicon wafer, glass, sapphire, and a sintered alumina body, as well as organic materials such as polyimide, polyvinyl alcohol, polyvinyl chloride, polyethylene terephthalate, polyvinylidene fluoride, polysiloxane, polyvinyl phenol (PVP), polyester, polycarbonate, polysulfone, polyether sulfone, polyethylene, polyphenylene sulfide, and polyparaxylene.

In addition, the substrate having plural materials laminated, such as a PVP film formed on a silicon wafer, a polysiloxane film formed on polyethylene terephthalate, or the like, may be used.

<Electrode>

Illustrative examples of the material to be used in the gate electrode, the source electrode, and the drain electrode include electric conductive metal oxides such as tin oxide, indium oxide, and indium tin oxide (ITO); metals of platinum, gold, silver, copper, iron, tin, zinc, aluminum, indium, chromium, lithium, sodium, potassium, cesium, calcium, magnesium, palladium, molybdenum, amorphous silicon, and polysilicon, and alloys thereof; inorganic electric conductive materials such as copper iodide and copper sulfide; polythiophene, polypyrrole, and polyaniline; a complex of polyethylene dioxythiophene with polystyrenesulfonic acid; electric conductive polymers whose conductivity is enhanced by means of doping of iodine or the like; and electric conductive materials such as a carbon material. These materials may be used singly, or as a laminate, or as a mixture of these materials.

Among these, sintered bodies of electric conductive powders including at least any one of silver, copper, gold, platinum, lead, tin, nickel, aluminum, tungsten, molybdenum, ruthenium oxide, chromium, titanium, carbon, and indium are preferable. These electric conductive powders may be used as a single body, as an alloy, or as mixed powders.

Among these, in view of conductivity, silver, copper, and gold are preferable; while in view of a cost and stability, silver is more preferable. Furthermore, in view of lowering the resistivity at the time of the low temperature curing of the applied film, the concurrent use of silver and carbon black is still more preferable.

The volume-average particle diameter of the electric conductive powder to be used in the electrode is preferably at least 0.02 μm and up to 10 μm, more preferably at least 0.02 μm and up to 5 μm, while still more preferably at least 0.02 μm and up to 2 μm.

When the volume-average particle diameter is 0.1 μm or larger, the contact probability among the electric conductive powders is increased so that the relative resistivity and the breakage probability of the formed electric conductive pattern can be decreased. In addition, because an active beam can smoothly transmit through the film during exposure, a fine patterning can be readily carried out.

When the volume-average particle diameter is 10 μm or smaller, the surface smoothness, the pattern accuracy, and the size accuracy of the circuit pattern after printing can be enhanced. Besides, in thinning of the pattern, the particle diameter needs to be smaller. For example, when the antenna having the film thickness of 2 μm is formed, the particle diameter also needs to be 2 μm or smaller.

The volume-average particle diameter can be calculated from the image of the electrode's section observed with a 3D-scanning electron microscope (SEM) or with a 3D-transmission electron microscope (TEM).

A content of the electric conductive body is preferably at least 70% by mass and up to 95% by mass, and more preferably at least 80% by mass and up to 90% by mass, relative to the total mass of the electrode materials. When the content is 70% by mass or larger, the contact area among the electric conductive powders themselves increases upon using the electric conductive powder as the electric conductive body, so that the relative resistivity and the breakage probability of the electric conductive pattern to be formed can be lowered. When the content is 95% by mass or smaller, an active beam can smoothly transmit through the film especially during exposure, so that a fine patterning can be readily carried out.

It is preferable that each of the electrodes include an organic binder in addition to the electric conductive body. In addition, it is preferable that the organic binder includes a photosensitive organic component.

When the organic binder is included in the semiconductor solution, the applicability of the semiconductor solution on the electrode can be improved so that the uniform semiconductor layer having the organic semiconductor and the carbon material smoothly applied can be formed. In addition, when the organic binder includes the photosensitive organic component, patterning of the electrode can be carried out by means of a photolithography without using a resist, so that the productivity can be further improved.

The photosensitive organic component includes a monomer, an oligomer, a polymer, these having a polymerizable unsaturated bond inside the molecule thereof, and/or addition reactants thereof.

As the monomer having a polymerizable unsaturated bond inside the molecule thereof, compounds having an active carbon-carbon unsaturated double bond may be used. Monofunctional or polyfunctional compounds having, as the functional group, a vinyl group, an allyl group, an acrylate group, a methacrylate group, or an acrylamide group may be used.

In the electrode material according to the present invention, one, or two or more of the photosensitive organic components may be used. A content of the photosensitive organic component is in the range of 1% by mass to 15% by mass, and more preferably in the range of 2% by mass to 10% by mass, relative to the total mass of the electrode material. When the content of the photosensitive organic component is smaller than 1% by mass, the sensitivity becomes so low that satisfactory patterning is difficult. On the other hand, when the content of the photosensitive organic component is larger than 15% by mass, the dried film becomes tacky so that a photomask contacts with this during exposure thereby causing problems of fouling of the photomask and irregularity of the coated film surface.

The oligomer or the polymer having a polymerizable unsaturated bond inside the molecule thereof may be obtained by polymerization or copolymerization of a component or components selected from the compounds having a carbon-carbon double bond. By adding a photoreactive group to the oligomer or the polymer in the side chain or the molecular terminal thereof, the oligomer or the polymer having a polymerizable unsaturated bond inside the molecule thereof can be obtained.

The preferable polymerizable unsaturated bond has an ethylenic unsaturated bond. Illustrative examples of the ethylenic unsaturated bond include a vinyl group, an allyl group, an acryl group, and a methacryl group.

As the method to add such a side chain to the oligomer or the polymer, there is the method in which an ethylenic unsaturated compound having a glycidyl group or an isocyanate group, or acrylic acid chloride, methacrylic acid chloride, or allyl chloride is caused to undergo an addition reaction to a mercapto group, an amino group, a hydroxy group, or a carboxy group in the oligomer or the polymer. It is preferable that the ethylenic unsaturated compound having the glycidyl group or the isocyanate group, or acrylic acid chloride, methacrylic acid chloride, or allyl chloride be caused to undergo the addition reaction, with the amount thereof being 0.05 to 1 mole equivalent, to the mercapto group, the amino group, the hydroxy group, or the carboxy group in the oligomer or the polymer.

In view of further enhancement in suppression effect to the pattern exfoliation upon folding of the electrode-attached substrate, it is preferable that the photosensitive organic component include a compound having a urethane group. For example, it is preferable that the oligomer or the polymer mentioned above include a urethane-modified compound that is formed by reacting the oligomer or the polymer having a hydroxy group in the side chain thereof with a compound having an isocyanate group.

In the oligomer or the polymer having the polymerizable unsaturated bond inside the molecule thereof as mentioned above, it is preferable that the weight-average molecular weight (Mw) be in the range or 2,000 to 200,000, and the number-average molecular weight (Mn) be in the range of 1,000 to 50,000; more preferable that Mw be in the range of 5,000 to 100,000 and Mn be in the range of 1,000 to 30,000. When Mw and Mn are within the ranges described above, handling thereof is convenient, and also a uniform cure can be achieved at the time of photocuring.

The electrode material according to the present invention includes the monomer, the oligomer, or the polymer, each having the polymerizable unsaturated group inside the molecule thereof; but these components do not have the capacity to absorb the energy of an active beam, so that a photopolymerization initiator is necessary in order to cause a photocuring. The photopolymerization initiator is selected in accordance with the light source to be used for photocuring, in which a radical photopolymerization initiator, a cationic photopolymerization initiator, or the like may be used.

In the electrode material according to the present invention, one, or two or more of the photopolymerization initiators may be used. A content of the photopolymerization initiator is in the range of 0.05% by mass to 10% by mass, and more preferably in the range of 0.1% by mass to 10% by mass, relative to the total mass of the electrode material. When the amount of the photopolymerization initiator is too small, the photocuring is insufficient; when the amount of the photopolymerization initiator is too large, compatibility can be deteriorated.

Concurrent use of a sensitizing agent with the photopolymerization initiator can enhance the sensitivity so that the wavelength range effective to the reaction can be expanded.

In the electrode material according to the present invention, one, or two or more of the sensitizer may be used. When the electrode material includes the sensitizer, a content thereof is usually in the range of 0.05% by mass to 10% by mass, and more preferably in the range of 0.1% by mass to 10% by mass, relative to the photosensitive organic component. When the amount of the sensitizer is too small, the effect to enhance photocuring cannot be expressed; when the amount of the sensitizer is too much, compatibility can be deteriorated.

The electrode material according to the present invention may be applied as a paste thereof. In order to form the paste, an organic solvent may be optionally used. When the organic solvent is used, viscosity of the paste can be adjusted so that the surface smoothness of the coated film can be enhanced. The electrode material according to the present invention may include an organic binder so far as the characteristics to be expected in the electrode are not impaired. The organic binder may include an additive such as a non-photosensitive polymer not having an unsaturated double bond inside the molecule thereof, a plasticizer, a leveling agent, a surfactant, a silane coupling agent, an anti-foaming agent, and a pigment. Specific examples of the non-photosensitive polymer include an epoxy resin, a novolak resin, a phenol resin, a polyimide precursor, and a polyimide.

Illustrative examples of the method for forming the electrode include the methods using heretofore known technologies such as resistance heating evaporation, electron beam evaporation, sputtering, plating, CVD, ion-plating coating, ink-jetting, and printing. In addition, among others, the method is known in which the paste including the organic component and the electric conductive body is applied onto the insulating substrate with a heretofore known technology such as a spin coating method, a blade coating method, a slit die coating method, a screen printing method, a bar coater method, a casting method, a transfer printing method, and an immersion and withdrawal method, followed by drying using an oven, a hot plate, an infrared light, or the like to form the electrode. The method is not particularly restricted so far as the electric conduction can be obtained.

Width and thickness of the electrode as well as a distance between the first electrode and the second electrode are arbitrary, though preferably, the width of the electrode is in the range of 5 μm to 1 mm, the thickness thereof is in the range of 0.01 μm to 100 μm, and the distance between the first electrode and the second electrode is in the range of 1 μm to 500 μm; but the ranges are not limited to these values.

Patterning method of the electrode may be any of the method in which the electrode thin film obtained by the method mentioned above is patterned to an intended form by means of a heretofore known photolithography method, and the method in which patterning is carried out via a mask having an intended form at the time of evaporation or sputtering of the electrode, wiring, or the connecting part material. In addition, direct patterning may be carried out by using an inkjet method or a printing method.

The gate electrode, the source electrode, and the drain electrode may be patterned separately, or at least two of them may be patterned at once. In view of reduction of the process and connection of the pattern, it is preferable to carry out the patterning of these electrodes all at once.

<Field-Effect Transistor>

Figure 2:
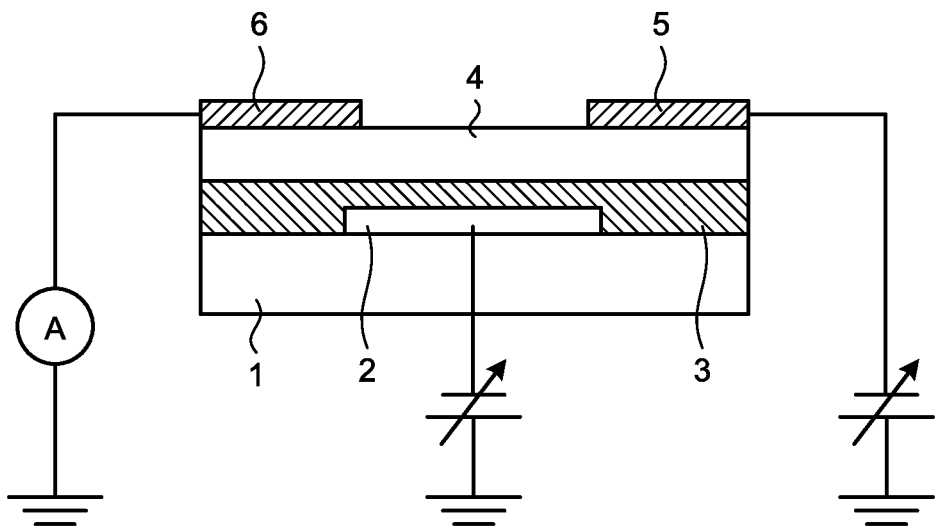
FIG. 2 is a schematic sectional view illustrating other example of the field-effect transistor according to the embodiment of the present invention.

FIG. 1 and FIG. 2 are schematic sectional views illustrating examples of the FET according to the embodiment of the present invention. In FIG. 1, after a source electrode 5 and a drain electrode 6 are formed on a substrate 1 having a gate electrode 2 covered with a gate insulating layer 3, a semiconductor layer 4 is further formed thereon. In FIG. 2, after the semiconductor layer 4 is formed on the substrate 1 having the gate electrode 2 covered with the gate insulating layer 3, the source electrode 5 and the drain electrode 6 are further formed thereon.

In the FET thus formed, the electric current between the source electrode 5 and the drain electrode 6 can be controlled by changing the gate voltage. The mobility of the FET can be calculated using the following formula (a).

$$\mu = (\delta Id/\delta Vg) L \cdot D / (W \cdot \varepsilon_r \cdot \varepsilon \cdot Vsd) \quad (a)$$

Here, Id (A) is the electric current between the source electrode 5 and the drain electrode 6; Vsd (V) is the voltage between the source electrode 5 and the drain electrode 6; Vg (V) is the gate voltage (voltage of the gate electrode 2); D (m) is the thickness of the gate insulating layer 3; L (m) is the channel length (distance between the source electrode 5 and the drain electrode 6); W (m) is the channel width (width of the source electrode 5 and the drain electrode 6); $\varepsilon_r$ is the relative dielectric constant of the gate insulating layer 3; and $\varepsilon$ is the dielectric constant under vacuum ($8.85 \times 10^{-12}$ F/m).

The on/off ratio can be obtained from the ratio of Id (on-current) at a certain minus gate voltage and Id (off-current) at a certain plus gate voltage.

The hysteresis can be obtained from the absolute value $|Vg^1 - Vg^2|$ of the difference between the gate voltage $Vg^1$ at $Id = 10^{-8}$ A upon applying Vg from plus to minus and the gate voltage $Vg^2$ at $Id = 10^{-8}$ A upon applying Vg from minus to plus.

The threshold voltage can be obtained from the intersection point between the extended line of the linear portion and the Vg axis in the Id-Vg graph. The gate current value at Vg=−20 V was taken as the leak current.

<Production Method of FET>

The production method of the FET according to the embodiment of the present invention includes:

(I) a step of forming an electric conductive pattern on a substrate, (II) a step of applying a solution including at least a polysiloxane having a structural unit represented by a general formula (1) onto the substrate having the electric conductive pattern formed thereon, followed by drying, and (III) a step of applying a solution including an organic semiconductor and/or a carbon material so as to be in contact with the electric conductive pattern, followed by drying.

Preferably, the production method of the FET according to the embodiment of the present invention includes:

(I) a step of forming an electric conductive pattern on a substrate, (II-A) a step of irradiating a film with active actinic light via a photomask, the film being obtained by applying onto the substrate having the electric conductive pattern formed thereon a solution including at least the polysiloxane having the structural unit represented by the general formula (1) and a photosensitive organic component followed by drying, followed by forming of a pattern turning into an opening on the electric conductive pattern by using an alkali solution, (II-B) a step of heating the pattern to form a cured pattern, and (III) a step of applying a solution including an organic semiconductor and/or a carbon material so as to be in contact with the electric conductive pattern, followed by drying.

The production method of the FET whose configuration is illustrated in FIG. 1 will be explained. Note that the production method is not limited to the one described below. First, an electric conductive pattern turning into the gate electrode 2 is formed on the substrate 1. Illustrative examples of a method for forming the electric conductive pattern include heretofore known methods such as a metal evaporation method, a spin coating method, a blade coating method, a slit die coating method, a screen printing method, a bar coating method, a casting method, a transfer printing method, an immersion and withdrawal method, and an inkjet method. Here, the pattern may be directly formed by using a mask or the like, or the gate electrode 2 may be patterned by the way that after a resist is applied onto the formed gate electrode, the resist film is exposed to form an intended pattern, developed, and then etched. In the case when an electric conductive paste having the photosensitive organic component is used, the gate electrode 2 may be patterned only from the electric conductive paste by means of photolithography without using the resist.

Next, the gate insulating layer 3 is formed on the substrate 1 having the gate electrode 2 formed thereon. Illustrative examples of the forming method of the gate insulating layer 3 include heretofore known methods in which the solution including at least a polysiloxane having a structural unit represented by a general formula (1) is applied by the method such as a spin coating method, a blade coating method, a slit die coating method, a screen printing method, a bar coating method, a casting method, a transfer printing method, an immersion and withdrawal method, or an inkjet method.

For the application process, the solution including the polysiloxane having the structural unit represented by the general formula (1) may include a solvent. Though the solvent is not particularly restricted, specific examples thereof include ethers such as propylene glycol monomethyl ether, propylene glycol mono-n-butyl ether, propylene glycol mono-t-butyl ether, ethylene glycol diethyl ether, and diethylene glycol ethyl methyl ether; acetates such as propylene glycol monomethyl ether acetate, 3-methoxybutyl acetate, 3-methyl-3-methoxybutyl acetate, and ethyl lactate; ketones such as acetyl acetone, methyl isobutyl ketone, and cyclopentanone; alcohols such as 3-methyl-3-methoxybutanol and diacetone alcohol; and aromatic hydrocarbons such as toluene and xylene. These solvents may be used singly, or as a mixture of two or more of them.

To obtain the coating film, the drying temperature of the applied solution is preferably in the range of 50° C. to 150° C. The heat-treatment temperature of the coating film to obtain the gate insulating layer 3 is preferably in the range of 100° C. to 300° C. In view of formation of the gate insulating layer 3 on a plastic substrate, the temperature thereof is more preferably 200° C. or lower.

In the course of obtaining the gate insulating layer 3 by the way as described above, patterning may be performed for the coating film or the gate insulating layer 3. When a circuit combined with the FET according to the embodiment of the present invention is formed, in order to obtain an electric conduction from the gate electrode 2 that is present under the gate insulating layer 3, a pattern turning into an opening (contact hole) needs to be formed.

Explanation will be made as to the formation of the negative pattern of the coating film using the composition including a photoradical generator and a radical polymerizable compound in the photosensitive organic component. An actinic light is applied (exposed) through a negative mask having an intended pattern from above the coating film. Examples of the actinic light to be used for exposure include a UV light, a visible light, an electron beam, and an X-ray; but in the present invention, an i-line (365 nm), an h-line (405 nm), or a g-line (436 nm) of a mercury lamp is preferably used. Next, the coating film thus exposed is developed. In the negative patterning, the exposed part is patterned as the insoluble part, and the unexposed part is patterned as the soluble part. As to the developing solution, an aqueous solution of an alkali compound such as tetramethyl ammonium hydroxide, diethanol amine, diethylamino ethanol, triethylamine, sodium hydroxide, potassium hydroxide, sodium carbonate, or potassium carbonate is preferable, in which one, or two or more of them may be included therein. To these alkali solutions, a solvent may be mixed, in which illustrative examples of the solvent to be used include a polar solvent such as N-methyl-2-pyrrolidone and γ-butyrolactone; an alcohol such as isopropanol; an ester such as ethyl lactate and propylene glycol monomethyl ether acetate; and a ketone such as cyclopentanone and methyl isobutyl ketone. After development, usually rinsing is carried out by using water; but rinsing may also be carried out by water added with an alcohol such as ethanol or isopropanol, or with an ester such as ethyl lactate or propylene glycol monomethyl ether acetate.

In the formation of the positive pattern of the coating film using the composition including a diazoketone compound as the photoacid generator in the photosensitive organic component, actinic light is applied through a positive mask having an intended pattern from above the coating film. Preferable actinic lights as well as the development and rinsing treatment of the coating film are the same as those in the case where the photoradical generator and the radical polymerizable compound are used in the photosensitive organic component. In the positive patterning, the exposed part is patterned as the soluble part, and the unexposed part is patterned as the insoluble part.

The gate insulating layer 3 can also be patterned by the process in which a resist is applied onto the gate insulating layer 3, and after the resist film is exposed and developed to an intended pattern, treated with an etching solution such as hydrofluoric acid. In this method, patterning can be carried out even for the composition not including the photosensitive organic component; but the number of the process increases. Therefore, the patterning using the material for the gate insulating layer including the photosensitive organic component is preferable because of a superior productivity. Furthermore, in view of improvement in the crack resistance of the gate insulating layer 3 to be obtained, it is preferable that the photosensitive organic component include the radical generating compound, the radical polymerizable compound, and/or the photoacid generator.

Next, the electric conductive pattern turning into the source electrode 5 and the drain electrode 6 is formed. Similarly to the gate electrode 2, illustrative examples of a method for forming the electric conductive pattern include heretofore known methods such as a metal evaporation method, a spin coating method, a blade coating method, a slit die coating method, a screen printing method, a bar coating method, a casting method, a transfer printing method, an immersion and withdrawal method, and an inkjet method. Here, the pattern may be directly formed by using a mask or the like, or the source electrode 5 and the drain electrode 6 may be patterned by the way that after a resist is applied onto the electrodes formed, the resist film is exposed and developed to an intended pattern, and then etched. In the case when an electric conductive paste having the photosensitive organic component is used, the source electrode 5 and the drain electrode 6 may also be patterned only from the electric conductive paste without using the resist by means of photolithography.

Next, the semiconductor layer 4 is formed to produce the FET. To form the semiconductor layer 4, dry methods such as a resistance heating evaporation method, an electron beam evaporation method, a sputtering method, and a CVD method may be used, but in view of a production cost and applicability to a large area, an application method is preferable. Illustrative examples of the application method include heretofore known application methods such as a spin coating method, a blade coating method, a slit die coating method, a screen printing method, a bar coating method, a casting method, a transfer printing method, an immersion and withdrawal method, and an inkjet method. The application method can be selected in accordance with the film characteristics to be obtained, such as control of the film thickness and the orientation. By means of these methods, the application is carried out so as to be in contact with the electric conductive pattern turning into the source electrode 5 and the drain electrode 6. The drying treatment is carried out to the film thus formed under the atmospheric air, under a reduced pressure, or under an inert gas atmosphere (under atmosphere of nitrogen or argon). The drying temperature is preferably in the range of 50° C. to 150° C.

Between the gate insulating layer 3 and the semiconductor layer 4, an orientated layer may also be disposed. The orientated layer may be formed with the same method as formation of the coating film of the material for the gate insulating layer. A second insulating layer may also be disposed to the semiconductor layer 4 in the side opposite to the gate insulating layer 3. The second insulating layer may be formed by the same way as the semiconductor layer 4.

The production method of the FET illustrated in the configuration of FIG. 2 may be carried out by reversing the order of the formation process of the electric conductive pattern turning into the source electrode 5 and the drain electrode 6 and the formation process of the semiconductor layer 4 in the production method of the FET illustrated in the configuration of FIG. 1. Note that the production method is not limited to the above.

The FET according to the embodiment of the present invention may be advantageously used in various devices such as a thin film FET, a photovoltaic device, a switching device, as well as a display, a wireless communication device, and a goods tag, using these devices.

<Wireless Communication Device>

The wireless communication device that includes the FET according to the embodiment of the present invention will be explained. Here, the wireless communication device is the device in which an electric communication is effected by receiving a carrier wave sent from an antenna that is mounted in the reader/writer such as RFID (Radio Frequency Identification), which is a non-contact type tag. In a specific action, for example, a radio signal sent from the antenna that is mounted in the reader/writer is received by the antenna of the RFID tag thereby converting it to a direct current by means of a rectifier circuit so that the RFID tag is electrified. Next, the electrified RFID tag receives a command from the radio signal, and then acts in response to the command. Thereafter, the answer to the result in response to the command is sent from the antenna of the RFID tag to the antenna of the reader/writer by means of a radio signal. Here, the action in response to the command is carried out at least by heretofore known circuits, i.e., a demodulation circuit, an action control logic circuit, and a modulation circuit.

Figure 3:
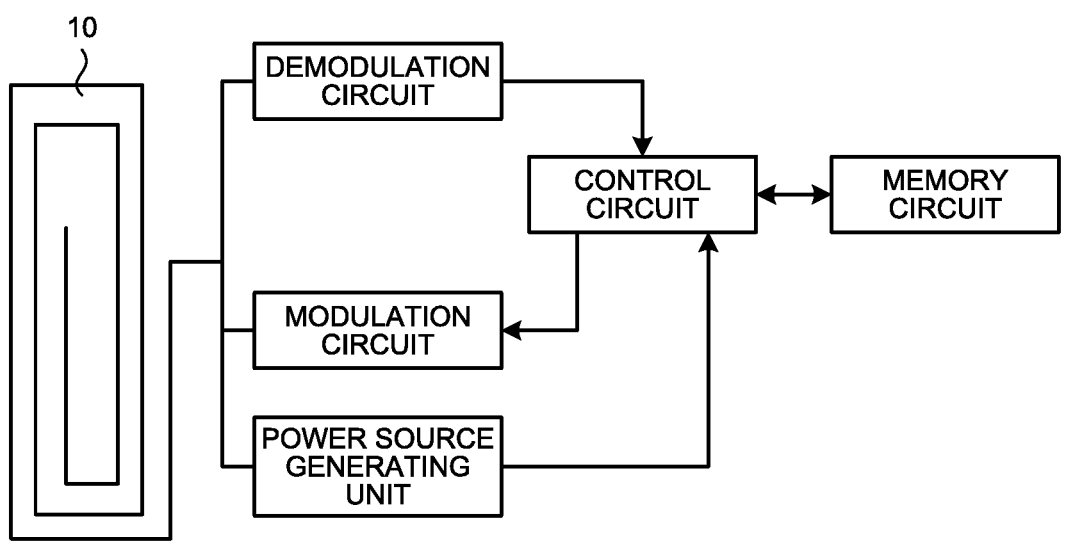
FIG. 3 is a block diagram illustrating an example of the wireless communication device using the field-effect transistor according to the embodiment of the present invention.

The wireless communication device according to the embodiment of the present invention has at least the FET and the antenna as described above. More specifically, the configuration of the wireless communication device may be exemplified, for example, as illustrated in FIG. 3, by the device that is composed of: a power source generating unit in which a modulated wave signal from outside received by the antenna 10 is rectified so as to deliver the power source to each unit; a demodulation circuit in which the modulated wave signal is demodulated so as to be sent out to a control circuit; a modulation circuit in which the data sent from the control circuit is modulated so as to be sent out to the antenna; and the control circuit in which the data demodulated in the demodulation circuit is written in a memory circuit and the data is read out from the memory circuit so as to be sent out to the modulation circuit, in which these circuit units are connected electrically. The demodulation circuit, the control circuit, the modulation circuit, and the memory circuit are composed of complementary semiconductor devices, and in addition, they may further include a condenser, a resistance element, and a diode. The memory circuit further includes a non-volatile rewritable memory unit such as EEPROM (Electrically Erasable Programmable Read-Only Memory) and FeRAM (Ferroelectric Random Access Memory). Here, the power source generating unit is composed of a condenser and a diode.

As the antenna, the condenser, the resistance element, the diode, and the non-volatile rewritable memory unit, any of those generally used may be used; and the material to be used and the shape thereof are not particularly restricted. As the material that connects them electrically, any electric conductive material that can be generally used may be used. The connecting method among them may be any method so far as it can obtain an electric conduction; and the width and thickness of the connecting part are arbitrary.

<Goods Tag>

The goods tag including the wireless communication device according to the embodiment of the present invention will be explained. This goods tag has, for example, a base and the wireless communication device covered with this base.

The base is formed of, for example, a non-metallic material such as a paper formed into a planar shape. For example, the base has a structure that two sheets of planar paper are bonded together, and the wireless communication device is disposed between these two sheets of paper. In the memory circuit of the wireless communication device, for example, the individual identification information to identify the individual goods is stored in advance.

The wireless communication is effected between the goods tag and the reader/writer. The reader/writer is the device with which the data to the goods tag are read and written wirelessly, thereby exchanging the data with the goods tag when the goods is in the distribution process or at the time of the account settlement. For example, there is a mobile type as well as a fixed type disposed in a cash register. Any heretofore known reader/writer may be used.

Specifically, the goods tag is provided with a reply function of the identification information with which the memorized individual identification information is replied wirelessly in response to the command from a prescribed reader/writer requesting to send the individual identification information. With this, for example, at a cash register of the goods, a large number of the goods can be simultaneously identified in a contactless manner, so that the settlement can be facilitated or made easier as compared with the identification with a barcode.

For example, at the time of payment for the goods, when the goods information that the reader/writer reads from the goods tag is sent to the POS (Point of Sale System) terminal, the sales registration of the goods that is identified by the goods information can be made in the POS terminal.

EXAMPLES

Hereinafter, the present invention will be explained by presenting Examples, but the present invention is not limited by these Examples. The evaluation methods in Examples will be explained in the following (1) to (8).

(1) Preparation of the Coating Film

A gate insulating layer material was applied onto a 6-inch silicon wafer or onto a 6-inch glass substrate by means of a spin coater so as to give the film thickness of 0.5 μm (after being dried), followed by drying by using a hot plate (SCW-636, manufactured by Dainippon Screen Mfg. Co., Ltd.) at 120° C. for 3 minutes to obtain the coating film.

(2)-1 Preparation of the Gate Insulating Layer (a)

By using a gate insulating layer material not including a photosensitive material, the gate insulating layer was prepared by the method described below. The coating film prepared on the 6-inch silicon wafer or on the 6-inch glass substrate in (1) was heated at a prescribed temperature for a prescribed period of time to obtain the gate insulating layer.

(2)-2 Preparation of the Gate Insulating Layer (b)

By using the gate insulating layer material including, in addition to a photosensitive material, a material including a photoradical generator and a radical polymerizable compound, the gate insulating layer was prepared by the method described below. The coating film on the 6-inch silicon wafer or on the 6-inch glass substrate formed with the method described above (1) was set to an i-line stepper (DSW-8000, manufactured by GCA Corp.), and then, irradiated from above the coating film through a negative mask having an intended pattern with an exposure amount of 100 mJ/cm$^2$ to 800 mJ/cm$^2$. After the exposure, the coated substrate was subjected to PEB on a hot plate at 90° C. for 1 minute, developed with a 2.38% by mass of a tetramethyl ammonium hydroxide (TMAH) aqueous solution (ELM-D, manufactured by Mitsubishi Gas Chemical Co., Ltd.) for 60 seconds, and then, rinsed with purified water. The film thus obtained was heated at a prescribed temperature for a prescribed period of time to obtain the gate insulating layer.

(2)-3 Preparation of the Gate Insulating Layer (c)

By using the gate insulating layer material including, in addition to a photosensitive material, a material including a diazo ketone compound as the photoacid generator, the gate insulating layer was prepared by the method described below. The coating film on the 6-inch silicon wafer or on the 6-inch glass substrate formed with the method described above (1) was set to the i-line stepper, and then, the coated substrate was irradiated from above the coating film through a positive mask having an intended pattern with an exposure amount of 100 mJ/cm$^2$ to 800 mJ/cm$^2$. After the exposure, the film was developed with the 2.38% by mass of a TMAH aqueous solution for 60 seconds, and then, rinsed with purified water. The film thus obtained was heated at a prescribed temperature for a prescribed period of time to obtain the gate insulating layer.

(3) Measurement of Film Thickness of the Gate Insulating Layer

By using a film thickness measuring instrument using optical interferometry (Lambda Ace STM-602, manufactured by Dainippon Screen Mfg. Co., Ltd.), the film thickness was measured at 10 different points in the plane on the substrate at the refractive index of 1.55; and the arithmetic average of these values was obtained as the film thickness of the gate insulating layer.

(4) Elemental Analysis

A soft X-ray was applied to a target film to be measured under an ultrahigh-vacuum condition; and by an X-ray photoelectron spectroscopy (Quantera SXM, manufactured by Physical Electronics, Inc. (PHI)), which detects photoelectrons emitted from the surface, the element information and the element amounts in the film were analyzed.

(5) Evaluation of Applicability of the Semiconductor Solution

A contact angle measurement instrument (CA-D type, manufactured by Kyowa Interface Science, Inc.) was used. A droplet of the semiconductor solution with a diameter of 1.5 mm was formed at the needle tip at room temperature; and then, contacted to the gate insulating layer on the 6-inch silicon wafer that was prepared by the way described in (2)-1, (2)-2, and (2)-3 to form a droplet thereon. The angle of the formed droplet with the surface thereof was measured as the contact angle. This was tested as described below. A, B, and C were determined to have passed the test because these semiconductor solutions had good applicability.

A: A contact angle was at least 6° and lower than 10°.
B: A contact angle was at least 5° and lower than 6°, or at least 10° and lower than 12°.
C: A contact angle was at least 4° and lower than 5°, or at least 12° and lower than 15°.
D: A contact angle was at least 3° and lower than 4°, or at least 15° and lower than 20°.
E: A contact angle was lower than 3° or 20° or higher.

(6) Evaluation of Crack Resistance of the Gate Insulating Layer

The film with the thickness of 50 nm was formed on the gate electrode pattern with the line width of 20 μm by means of application as describe later, and was heated under a nitrogen stream at 200° C. for 30 minutes to obtain the gate insulating layer. From observation of the formed gate insulating layer by an optical microscope, the generation rate of the crack formed near the electrode was calculated from total of the observation result of each element; and "100−(crack generation rate %)" was used as an index of the crack resistance. This was tested as described below. A, B, and C were determined to have passed the test because these gate insulating layers had good crack resistances.

A: Crack resistance was 100%.
B: Crack resistance was at least 98% and lower than 100%.
C: Crack resistance was at least 94% and lower than 98%.
D: Crack resistance was at least 91% and lower than 94%.
E: Crack resistance was lower than 91%.

(7) Evaluation of FET Characteristics

After the FET was obtained, upon changing the gate voltage (Vg), the characteristic with regard to the current (Id) between the source and the drain and the voltage between the source and the drain (Vsd) (Id-Vsd characteristic) was measured. In the measurement the semiconductor characteristic evaluation system (4200-SCS type, manufactured by Keithley Instruments, Inc.) was used under the atmospheric air (temperature at 20° C. and humidity of 35%). The hysteresis was obtained from the absolute value $|Vg^1-Vg^2|$ of the difference between the gate voltage $Vg^1$ at Id=$10^{-8}$ A upon applying Vg from plus to minus and the gate voltage $Vg^2$ at Id=$10^{-8}$ A upon applying Vg from minus to plus. This was tested as described below. A, B, and C were determined to have passed the test because these indicated low hysterisises.

A: Hysteresis was up to 5 V.
B: Hysteresis was higher than 5 V and up to 10 V.
C: Hysteresis was higher than 10 V and up to 20 V.
D: Hysteresis was higher than 20 V and up to 30 V.
E: Hysteresis was higher than 30 V.

In addition, from the gate current value at Vg=−20 V, the leak current was obtained. This was tested as described below. A, B, and C were determined to have passed the test because these indicated low leak currents.

A: Leak current was up to 10 pA.
B+: Leak current was higher than 10 pA and up to 15 pA.
B: Leak current was higher than 15 pA and up to 20 pA.

C+: Leak current was higher than 20 pA and up to 25 pA.
C: Leak current was higher than 25 pA and up to 30 pA.
D: Leak current was higher than 30 pA and up to 50 pA.
E: Leak current was higher than 50 pA.

(8) Evaluation of Photosensitivity Characteristics

By using the optical microscope Lambda Ace STM-602, the photosensitivity and the resolution of the coating film formed on the 6-inch silicon wafer prepared by the method described in (2)-2 and (2)-3 were evaluated. Here, the exposure amount to form a 100 μm 1:1 line-and-space pattern (hereinafter, this amount is called "optimum exposure amount") was taken as the photosensitivity, and the minimum pattern size after development with the optimum exposure amount was taken as the resolution. This was tested as described below. A, B, and C were determined to have passed the test because these indicated superior resolutions.

A: Resolution was up to 5 μm.
B: Resolution was higher than 5 μm and up to 15 μm.
C: Resolution was higher than 15 μm and up to 30 μm.
D: Resolution was higher than 30 μm and up to 45 μm.
E: Resolution was higher than 45 μm.

Example 1

(1) Preparation of Semiconductor Solution A

Into a flask containing 5 mL of chloroform was charged 0.10 g of poly-3-hexylthiopene (regioregular; number-average molecular weight (Mn) of 13,000 (hereinafter this is called "P3HT"), manufactured by Aldrich Inc.); and then, the mixture was stirred by mans of ultrasonic waves using an ultrasonic cleaning device (US-2; output power of 120 W, manufactured by Iuchi Seieido Co., Ltd.) to obtain a chloroform solution of P3HT. Next, this solution was taken into a pipette; and then, the solution was added into a mixed solution of 20 mL of methanol and 10 mL of 0.1-N hydrochloric acid dropwise with an amount of 0.5 mL at a time to effect reprecipitation. The solid P3HT thereby precipitated was collected by filtration by means of a membrane filter (tetrafluoroethylene, manufactured by PTFE Inc.) having a pore diameter of 0.1 μm; and then, after the resultant solid was thoroughly rinsed with methanol, the solvent was removed by means of vacuum drying. Dissolution and reprecipitation each were repeated once more to obtain 90 mg of reprecipitated P3HT.

Next, 1.5 mg of CNT (single-walled CNT; purity of 95%, manufactured by CNI Inc.) and 1.5 mg of the reprecipitated P3HT were added into 15 mL of chloroform; and then, the mixture was stirred with cooling by ice by means of ultrasonic waves using an ultrasonic wave homogenizer (VCX-500, manufactured by Tokyo Rikakikai Co., Ltd.) with an output power of 250 W for 30 minutes. When irradiation with the ultrasonic waves was effected for 30 minutes, the irradiation was stopped once, and 1.5 mg of the reprecipitated P3HT was further added. The resulting mixture was irradiated with the ultrasonic waves for further 1 minute to obtain the CNT dispersion solution A including the CNT composite having P3HT on at least part of the CNT surface (CNT composite concentration to the solvent was 0.1 g/L).

Next, the semiconductor solution to form the semiconductor layer 4 was prepared. The obtained CNT dispersion solution A was filtrated by using a membrane filter (Omnipore Membrane; pore diameter of 10 μm and diameter of 25 mm, manufactured by Millipore Inc.) to remove the CNT composite having the length of 10 μm or longer. By adding 45 mL of dichlorobenzene to 5 mL of the filtrate thus obtained, the semiconductor solution A was obtained (CNT composite concentration to the solvent was 0.01 g/L).

(2) Preparation of the Insulating Layer Material Solution A

Into 215.91 g of propylene glycol monomethyl ether acetate (PGMEA; boiling point of 146° C.) were dissolved 13.12 g (0.05 mole) of 3-trimethyoxysilylpropyl succinic acid anhydride (SucSi), 93.73 g (0.40 mole) of 3-acryloxypropyl trimethoxy silane (AcrSi), and 109.06 g (0.55 mole) of phenyl trimethoxy silane (PheSi) and then, to the mixture were further added 54.90 g of water and 0.864 g of phosphoric acid with stirring. The resulting solution was heated at a bath temperature of 105° C. for 2 hours; and then, the inside temperature was raised to 90° C. to distill out the component including mainly the by-produced methanol. Next, the solution was heated at a bath temperature of 130° C. for 2 hours; and then, the inside temperature was raised to 118° C. to distill out the component including mainly water and methanol. Then, the solution was cooled to room temperature to obtain the polysiloxane solution A with the solid component concentration of 26.0% by mass. Weighted was 10 g of the polysiloxane solution A thus obtained and mixed with 0.83 g of PGMEA; and then, the resulting mixture was stirred at room temperature for 2 hours to obtain the insulating layer material solution A (solid component concentration of 24% by mass).

(3) Preparation of FET

The FET illustrated in FIG. 1 was prepared. On the substrate 1 made of glass (film thickness of 0.7 mm), gold was vacuum-evaporated through a mask by means of a resistance heating evaporation to form the gate electrode 2 having the gold thickness of 50 nm. Next, the insulating layer material solution A previously prepared was applied by means of a spin coating method (800 rpm for 20 seconds) onto the substrate 1 having the gate electrode 2 formed thereon. The coated substrate was heated at 120° C. for 3 minutes, and further heated at 200° C. under a nitrogen stream for 30 minutes to form the gate insulating layer 3 with the film thickness of 400 nm. Next, gold was vacuum-evaporated by means of a resistance heating evaporation so as to give the film thickness of 50 nm, onto which a photoresist (trade name of "LC100-10cP"; manufactured by Rohm & Haas Co.) was applied by means of a spin coating method (1,000 rpm for 20 seconds); followed by drying by heating at 100° C. for 10 minutes. The prepared photoresist film was pattern-exposed through a mask by using a parallel light mask aligner (PLA-501F, manufactured by Canon Inc.), developed with a 2.38% by mass of a tetramethyl ammonium hydroxide aqueous solution ELM-D (trade name; manufactured by Mitsubishi Gas Chemical Co., Ltd.) for 70 seconds by means of a shower development using an autodeveloping apparatus (AD-2000, manufactured by Takizawa Sangyo K. K.); and then, rinsed with water for 30 seconds. Thereafter, the film was etched with AURUM-302 (trade name, manufactured by Kanto Chemical Co., Inc.) for 5 minutes; and then, rinsed with water for 30 seconds. Next, the resist was removed by soaking it in AZ Remover 100 (trade name; manufactured by Merk Performance Materials Ltd.) for 5 minutes and rinsed with water for 30 seconds; followed by drying by heating at 120° C. for 20 minutes to form the source electrode 5 and the drain electrode 6.

The line width of the gate electrode 2 was 20 μm. The width (channel width) of both the source electrode 5 and the drain electrode 6 was 100 μm; and the distance (channel length) between the source electrode 5 and the drain electrode 6 was 10 μm. Onto the substrate 1 having the source electrode 5 and the drain electrode 6 formed thereon, 400 μL of the semiconductor solution A previously prepared was dropped by using an inkjet apparatus (manufactured by Cluster Technology Co., Ltd.); and then, heated on a hot plate under a nitrogen stream at 150° C. for 30 minutes to form the semiconductor layer 4 thereby obtaining the FET. The FET thus obtained was evaluated in accordance with the evaluation methods (3) to (8).

Example 2

Weighted was 10 g of the polysiloxane solution A prepared in Example 1; mixed with 1.04 g of DPHA (dipentaerythritol hexaacrylate; trade name of "KAYARAD", manufactured by Nippon Kayaku Co., Ltd.), 0.15 g of OXE-01 (trade name of "Irgacure", manufactured by BASF Japan Ltd.), and 4.60 g of PGMEA; and then, the resulting mixture was stirred at room temperature for 2 hours to obtain the insulating layer material solution B (solid component concentration of 24% by mass). A content of DPHA in the insulating layer material solution B was 40 parts by mass relative to 60 parts by mass of the polysiloxane. A content of OXE-01 in the insulating layer material solution B was 3.5 parts by mass relative to 60 parts by mass of the polysiloxane. In according with "(2)-2 Preparation of the Gate Insulating Layer (b)", by using the insulating layer material solution B including the photosensitive organic component, the gate insulating layer 3 and the FET were prepared and evaluated by the same way as Example 1 except for the above mentioned.

Examples 3 to 15

By using the insulating layer material solutions C to O listed in Table 1, the semiconductor solution A, and the electrode material (Au), the FETs were prepared and evaluated by the same way as Example 2.

Example 16

The FET was prepared and evaluated by the same way as Example 10 except that the insulating layer material solution P using 3-trimethoxysilyl propylglutaricacid anhydride (GltSi) was used in place of SucSi.

Example 17

The FET was prepared and evaluated by the same way as Example 16 except that the insulating layer material solution Q using 3-(3-trimethoxysilylpropyloxy)propane-1,2-dithiol (DMrcSi) was used in place of GltSi.

Example 18

The FET was prepared and evaluated by the same way as Example 17 except that the insulating layer material solution R with the solid component concentration of 24% by mass, not added with DPHA or OXE-01, was used.

Example 19

Weighted was 10 g of the polysiloxane solution A; and then, mixed with 1.04 g of DPHA, 0.15 g of OXE-01, 1.35 g of aluminum tris(2,4-pentanedionato) (trade name of "Alumi Chelate A (W)", hereinafter this is called AlA (W); manufactured by Kawaken Fine Chemicals Co., Ltd.), and 7.53 g of PGMEA. The resulting mixture was stirred at room temperature for 2 hours to obtain the insulating layer material solution S (solid component concentration of 24% by mass). A content of AlA (W) in the insulating layer material solution S was 28 parts by mass relative to total 100 parts by mass of the polysiloxane and DPHA. By using the insulating layer material solution S, the gate insulating layer 3 and the FET were prepared and evaluated by the same way as Example 2.

Example 20

The gate insulating layer 3 and the FET were prepared and evaluated by the same way as Example 19 except that when preparing the semiconductor solution, only CNT was used without using P3HT and this solution was used as the semiconductor solution B for formation of the semiconductor layer 4.

Example 21

The gate insulating layer 3 and the FET were prepared and evaluated by the same way as Example 19 except that when preparing the semiconductor solution, only P3HT was used without using CNT and this solution was used as the semiconductor solution C for formation of the semiconductor layer 4.

Example 22

By using the electric conductive paste including the photosensitive organic component, the electrode was prepared by the way as described below.

Into a 100-mL clean bottle were introduced 20 g of an acryl polymer (trade name of "SPCR-69X; weight-average molecular weight of 15,000, manufactured by Showa Denko K. K.), 4 g of a photopolymerization initiator (OXE-01, manufactured by BASF Japan Ltd.), 0.6 g of an acid generator (SI-110, manufactured by Sanshin Chemical Industry Co., Ltd.), and 10 g of γ-butyrolactone (manufactured by Mitsubishi Gas Chemical Co., Ltd.); and then, the mixture was mixed by using a rotation and revolution vacuum mixer (registered trade mark of "Awatori-Rentaro ARE-310", manufactured by Thinky Corp.) to obtain 46.6 g of a photosensitive resin solution (solid component concentration of 78.5% by mass). A mixture of 8.0 g of the obtained photosensitive resin solution with 42.0 g of silver particles with the average particle diameter of 2 μm was kneaded with a three roll mill (trade name of "EXAKT M-50", manufactured by EXAKT GmbH) to obtain 50 g of a photosensitive Ag paste.

The photosensitive Ag paste was applied onto the substrate 1 made of glass by means of a screen printing method, and then, prebaked in a drying oven at 100° C. for 10 minutes. Then, by using an exposure apparatus (trade name of "PEM-8M"; manufactured by Union Optical Co., Ltd.), the all-wavelength exposure was carried out via a photomask having a mask pattern corresponding to the electrode with the exposure amount of 70 mJ/cm$^2$ (converted amount at the wavelength of 365 nm), followed by a dip development in a 0.5% $Na_2CO_3$ solution for 30 seconds. After rinsing with ultrapure water, curing was carried out in a drying oven at 140° C. for 30 minutes to obtain the gate electrode 2. With the same procedure, the source electrode 5 and the drain electrode 6 were prepared. The gate insulating layer 3 and FET were prepared and evaluated by the same way as Example 19 except for the processes described above.

Example 23

First, the photoacid generator was synthesized by the way as follows.

Under a dry nitrogen stream, 15.32 g (0.05 mole) of Ph-cc-AP-MF (trade name; manufactured by Honshu Chemical Industry Co., Ltd.) and 37.62 g (0.14 mole) of 5-naphtoquinonediazido sulfonyl chloride were dissolved into 450 g of 1,4-dioxane. After the temperature of the resulting solution was set at room temperature, a mixture of 15.58 g (0.154 mole) of triethylamine with 50 g of 1,4-dioxane was added dropwise so as not to raise the temperature inside the system to 35° C. or higher. After the dropwise addition, the reaction solution was stirred at 30° C. for 2 hours. After the trimethyl ammonium salt was removed by filtration, the filtrate was poured into water. Then, the separated precipitate was collected by filtration. The precipitate was dried in a vacuum dryer to obtain a diazonaphthoquinone compound (QD-01; a monoester to a trimester of 4-[1-(4-hydroxyphenyl)-1-phenylethyl]-1,2-benzenediol with 6-diazo-5,6-dihydro-5-oxo-naphthalene-1-sulfonic acid).

Next, 10 g of the polysiloxane solution A was weighed; and then, mixed with 1.19 g of QD-01, 1.38 g of AlA (W), and 7.53 g of PGMEA. The resulting mixture was stirred at room temperature for 2 hours to obtain the insulating layer material solution Z (solid component concentration of 24% by mass). A content of AlA (W) in the insulating layer material solution Z was 28 parts by mass relative to total 100 parts by mass of the polysiloxane and QD-01. By using the insulating layer material solution Z, the gate insulating layer 3 was prepared by following the procedure in "(2)-3 Preparation of the Gate Insulating Layer (c)"; and then, the FET was prepared and evaluated by the same way as Example 22.

Comparative Example 1

The FET was prepared and evaluated by the same way as Example 1 except that the insulating layer material solution T using 0.45 mole of 3-trimethoxysilyl propylthiol (MrcSi) in place of SucSi and AcrSi was used.

Comparative Example 2

The FET was prepared and evaluated by the same way as Example 2 except that the insulating layer material solution U using 0.45 mole of MrcSi in place of SucSi and AcrSi was used.

The materials used in preparation of the FETs in Examples 1 to 23 and Comparative Examples 1 to 2 are summarized in Tables 1 to 2, and the various evaluation results are summarized in Tables 3 to 4.

TABLE 1

| | | Insulating layer material solution (composition) | | | | | | | | |
|---|---|---|---|---|---|---|---|---|---|---|
| | | Polysiloxane [% by mole] | | | | | | | | |
| | Composition | Silane compound corresponding to the general formula (1) | Silane compound corresponding to the general formula (4) | Silane compound corresponding to other structural units | Metal chelate | Radical polymerizable compound | Photoradical generator or photoacid generator | Solvent | Semiconductor solution | Electrode material |
| Example 1 | A | SucSi [5] | AcrSi [40] | PheSi [55] | — | — | — | PGMEA | A | Au |
| Example 2 | B | SucSi [5] | AcrSi [40] | PheSi [55] | — | DPHA | OXE-01 | PGMEA | A | Au |
| Example 3 | C | SucSi [1.6] | AcrSi [40] | PheSi [58.4] | — | DPHA | OXE-01 | PGMEA | A | Au |
| Example 4 | D | SucSi [0.8] | AcrSi [40] | PheSi [59.2] | — | DPHA | OXE-01 | PGMEA | A | Au |
| Example 5 | E | SucSi [15] | AcrSi [40] | PheSi [45] | — | DPHA | OXE-01 | PGMEA | A | Au |
| Example 6 | F | SucSi [35] | AcrSi [40] | PheSi [25] | — | DPHA | OXE-01 | PGMEA | A | Au |
| Example 7 | G | SucSi [50] | AcrSi [40] | PheSi [10] | — | DPHA | OXE-01 | PGMEA | A | Au |
| Example 8 | H | SucSi [5] | AcrSi [10] | PheSi [85] | — | DPHA | OXE-01 | PGMEA | A | Au |
| Example 9 | I | SucSi [5] | AcrSi [3] | PheSi [92] | — | DPHA | OXE-01 | PGMEA | A | Au |
| Example 10 | J | SucSi [5] | — | PheSi [95] | — | DPHA | OXE-01 | PGMEA | A | Au |
| Example 11 | K | SucSi [0.8] | — | PheSi [99.2] | — | DPHA | OXE-01 | PGMEA | A | Au |
| Example 12 | L | SucSi [0.8] | AcrSi [3] | PheSi [96.2] | — | DPHA | OXE-01 | PGMEA | A | Au |
| Example 13 | M | SucSi [5] | AcrSi [55] | PheSi [40] | — | DPHA | OXE-01 | PGMEA | A | Au |
| Example 14 | N | SucSi [5] | AcrSi [70] | PheSi [25] | — | DPHA | OXE-01 | PGMEA | A | Au |
| Example 15 | O | SucSi [5] | AcrSi [80] | PheSi [15] | — | DPHA | OXE-01 | PGMEA | A | Au |

TABLE 2

| | | Insulating layer material solution (composition) | | | | | | | | |
|---|---|---|---|---|---|---|---|---|---|---|
| | | Polysiloxane [% by mole] | | | | | | | | |
| | Composition | Silane compound corresponding to the general formula (1) | Silane compound corresponding to the general formula (4) | Silane compound corresponding to other structural units | Metal chelate | Radical polymerizable compound | Photoradical generator or photoacid generator | Solvent | Semiconductor solution | Electrode material |
| Example 16 | P | GltSi [5] | — | PheSi [95] | — | DPHA | OXE-01 | PGMEA | A | Au |

TABLE 2-continued

| | | Insulating layer material solution (composition) | | | | | | | | |
|---|---|---|---|---|---|---|---|---|---|---|
| | | Polysiloxane [% by mole] | | | | | | | | |
| | Composition | Silane compound corresponding to the general formula (1) | Silane compound corresponding to the general formula (4) | Silane compound corresponding to other structural units | Metal chelate | Radical polymerizable compound | Photoradical generator or photoacid generator | Solvent | Semiconductor solution | Electrode material |
| Example 17 | Q | DMrcSi [5] | — | PheSi [95] | — | DPHA | OXE-01 | PGMEA | A | Au |
| Example 18 | R | DMrcSi [5] | — | PheSi [95] | — | — | — | PGMEA | A | Au |
| Example 19 | S | SucSi [5] | AcrSi [40] | PheSi [55] | AlA (W) | DPHA | OXE-01 | PGMEA | A | Au |
| Example 20 | S | SucSi [5] | AcrSi [40] | PheSi [55] | AlA (W) | DPHA | OXE-01 | PGMEA | B | Au |
| Example 21 | S | SucSi [5] | AcrSi [40] | PheSi [55] | AlA (W) | DPHA | OXE-01 | PGMEA | C | Au |
| Example 22 | S | SucSi [5] | AcrSi [40] | PheSi [55] | AlA (W) | DPHA | OXE-01 | PGMEA | A | Photosensitive Ag paste |
| Example 23 | Z | SucSi [5] | AcrSi [40] | PheSi [55] | AlA (W) | — | QD-01 | PGMEA | A | Photosensitive Ag paste |
| Comparative Example 1 | T | — | — | PheSi [55] | MrcSi [45] | — | — | PGMEA | A | Au |
| Comparative Example 2 | U | — | — | PheSi [55] | MrcSi [45] | — | DPHA | OXE-01 | PGMEA | A | Au |

TABLE 3

| | Insulating layer material solution (composition) | Semiconductor solution | Electrode material | Gate insulating layer | | | Applicability of semiconductor solution [°] | Crack resistance [%] | FET characteristics | | Photosensitive characteristic Resolution [μm] |
|---|---|---|---|---|---|---|---|---|---|---|---|
| | | | | Polysiloxane | | Weight ratio of metal atom to 100 parts by mass of carbon atom and silicon atom | | | | | |
| | | | | Structural unit of the general formula (1) [% by mole] | Structural unit of the general formula (4) [% by mole] | | | | Hysteresis [V] | Leak current [pA] | |
| Example 1 | A | A | Au | 2.5 | 28 | 0 | A [6.7] | A [100] | A [5] | A [6] | — |
| Example 2 | B | A | Au | 2.5 | 28 | 0 | A [6.6] | A [100] | A [5] | A [5] | A [5] |
| Example 3 | C | A | Au | 0.8 | 28 | 0 | B [5.8] | B [99] | B [9] | B+ [12] | B [10] |
| Example 4 | D | A | Au | 0.4 | 28 | 0 | C [4.7] | B [98] | C [15] | B [16] | C [25] |
| Example 5 | E | A | Au | 7.5 | 28 | 0 | A [7.2] | A [100] | A [4] | A [9] | A [4] |
| Example 6 | F | A | Au | 18 | 28 | 0 | A [8.6] | A [100] | A [3] | B+ [14] | A [4] |
| Example 7 | G | A | Au | 25 | 28 | 0 | A [9.8] | A [100] | A [3] | C [26] | A [4] |
| Example 8 | H | A | Au | 2.5 | 7 | 0 | A [6.2] | B [99] | A [5] | B+ [14] | A [5] |
| Example 9 | I | A | Au | 2.5 | 2.1 | 0 | A [6.1] | B [98] | A [5] | B [19] | A [5] |
| Example 10 | J | A | Au | 2.5 | 0 | 0 | A [6.0] | C [97] | A [5] | C+ [22] | A [5] |
| Example 11 | K | A | Au | 0.4 | 0 | 0 | C [4.4] | C [95] | C [17] | C [27] | C [30] |
| Example 12 | L | A | Au | 0.4 | 2.1 | 0 | C [4.5] | C [97] | C [16] | C+ [24] | C [30] |
| Example 13 | M | A | Au | 2.5 | 39 | 0 | A [6.7] | A [100] | A [5] | A [5] | A [5] |
| Example 14 | N | A | Au | 2.5 | 49 | 0 | A [6.8] | A [100] | A [5] | A [4] | B [10] |
| Example 15 | O | A | Au | 2.5 | 56 | 0 | A [6.9] | A [100] | A [5] | A [4] | C [20] |

TABLE 4

| | Insulating layer material solution (composition) | Semi-conductor solution | Electrode material | Gate insulating layer Polysiloxane Structural unit of the general formula (1) [% by mole] | Structural unit of the general formula (4) [% by mole] | Weight ratio of metal atom to 100 parts by mass of carbon atom and silicon atom | Applicability of semi-conductor solution [°] | Crack resistance [%] | FET characteristics Hysteresis [V] | Leak current [pA] | Photo-sensitive characteristic Resolution [μm] |
|---|---|---|---|---|---|---|---|---|---|---|---|
| Example 16 | P | A | Au | 2.5 | 0 | 0 | B [5.9] | C [95] | B [8] | C [28] | B [15] |
| Example 17 | Q | A | Au | 5 | 0 | 0 | C [4.8] | C [95] | C [11] | C [30] | C [30] |
| Example 18 | R | A | Au | 5 | 0 | 0 | C [4.7] | C [95] | C [12] | C [30] | — |
| Example 19 | S | A | Au | 2.5 | 28 | 2.0 | A [6.7] | A [100] | A [2] | A [3] | A [5] |
| Example 20 | S | B | Au | 2.5 | 28 | 2.0 | A [6.8] | A [100] | B [7] | A [3] | A [5] |
| Example 21 | S | C | Au | 2.5 | 28 | 2.0 | A [6.6] | A [100] | C [12] | A [3] | A [5] |
| Example 22 | S | A | Photo-sensitive Ag paste | 2.5 | 28 | 2.0 | A [6.4] | A [100] | A [2] | A [3] | A [5] |
| Example 23 | Z | A | Photo-sensitive Ag paste | 2.5 | 28 | 2.0 | A [6.6] | A [100] | A [2] | A [3] | A [5] |
| Comparative Example 1 | T | A | Au | 0 | 0 | 0 | D [3.9] | E [90] | D [24] | E [54] | — |
| Comparative Example 2 | U | A | Au | 0 | 0 | 0 | D [3.8] | D [91] | D [25] | E [52] | E [50] |

REFERENCE SINGS LIST

1 Substrate
2 Gate electrode
3 Gate insulating layer
4 Semiconductor layer
5 Source electrode
6 Drain electrode
10 Antenna

The invention claimed is:

1. A field-effect transistor comprising at least:
a substrate;
a source electrode;
a drain electrode;
a gate electrode;
a semiconductor layer in contact with the source electrode and with the drain electrode; and
a gate insulating layer insulating between the semiconductor layer and the gate electrode,
the semiconductor layer comprising an organic semiconductor and/or a carbon material, and
the gate insulating layer comprising at least a polysiloxane having a structural unit represented by a general formula (1):

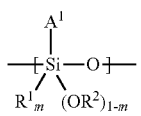

(1)

in the general formula (1), $R^1$ represents a hydrogen atom, an alkyl group, a cycloalkyl group, a heterocyclic group, an aryl group, a heteroaryl group, or an alkenyl group; $R^2$ represents a hydrogen atom, an alkyl group, a cycloalkyl group, or a silyl group; m represents 0 or 1; $A^1$ represents an organic group including at least two groups selected from a carboxy group, a sulfo group, a thiol group, a phenolic hydroxy group, or a derivative of these groups; when the derivative is a cyclic condensed structure formed by two groups out of the carboxy group, the sulfo group, the thiol group, and the phenolic hydroxy group, $A^1$ represents an organic group having at least one the cyclic condensed structure.

2. The field-effect transistor according to claim 1, wherein $A^1$ in the general formula (1) is an organic group having at least two carboxy groups or derivatives of the carboxy groups, or an organic group having at least one cyclic acid anhydride group.

3. The field-effect transistor according to claim 1, wherein $A^1$ in the general formula (1) is a group represented by a following general formula (2) or (3):

(2)

$$\begin{array}{c} COOR^3 \\ | \\ COOR^4 \\ | \\ X^1 \\ | \end{array}$$

(3)

in the general formula (2), $X^1$ represents a single bond, an alkylene group having 1 to 10 carbon atoms, or an arylene group having 6 to 15 carbon atoms; $R^3$ and $R^4$ represent independently a hydrogen atom, an organic group, or a silyl group; in the general formula (3), $X^2$ represents a single bond, an alkylene group having 1 to 10 carbon atoms, or an arylene group having 6 to 15 carbon atoms.

4. The field-effect transistor according to claim 1, wherein the polysiloxane contains the structural unit represented by the general formula (1) with a rate of at least 0.5% by mole and up to 20% by mole relative to entire silane structural units.

5. The field-effect transistor according to claim 1, wherein the polysiloxane further has a structural unit represented by a following general formula (4):

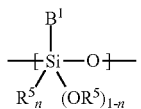

(4)

in the general formula (4), $R^5$ represents a hydrogen atom, an alkyl group, a cycloalkyl group, a heterocyclic group, an aryl group, a hetero-aryl group, or an alkenyl group; $R^6$ represents a hydrogen atom, an alkyl group, a cycloalkyl group, or a silyl group; n represents 0 or 1; $B^1$ represents an organic group including an addition reaction structure formed among an acryl group and/or a methacryl group themselves.

6. The field-effect transistor according to claim 5, wherein the polysiloxane contains the structural unit represented by the general formula (4) with a rate of at least 5% by mole and up to 50% by mole relative to entire silane structural units.

7. The field-effect transistor according to claim 1, wherein the semiconductor layer includes a carbon nanotube.

8. The field-effect transistor according to claim 7, wherein the carbon nanotube includes a carbon nanotube composite having a conjugated polymer attached to at least part of surface of the carbon nanotube.

9. The field-effect transistor according to claim 1, wherein the source electrode, the drain electrode, and/or the gate electrode include(s) an organic binder and an electric conductive body.

10. The field-effect transistor according to claim 1, wherein the gate insulating layer includes a metal compound having a bond between a metal atom and an oxygen atom.

11. A method for producing the field-effect transistor according to claim 1, the method comprising:
    (I) a step of forming an electric conductive pattern on a substrate;
    (II) a step of applying a solution including at least a polysiloxane having a structural unit represented by the general formula (1) onto the substrate having the electric conductive pattern formed thereon, followed by drying; and
    (III) a step of applying a solution including an organic semiconductor and/or a carbon material so as to be in contact with the electric conductive pattern, followed by drying.

12. The method for producing the field-effect transistor according to claim 11, the method comprising:
    (I) a step of forming an electric conductive pattern on a substrate,
    (II-A) a step of irradiating a film with active actinic light via a photomask, the film being obtained by applying onto the substrate having the electric conductive pattern formed thereon a solution including at least the polysiloxane having the structural unit represented by the general formula (1) and a photosensitive organic component followed by drying, followed by forming of a pattern turning into an opening on the electric conductive pattern using an alkali solution,
    (II-B) a step of heating the pattern to form a cured pattern, and
    (III) a step of applying a solution including an organic semiconductor and/or a carbon material so as to be in contact with the electric conductive pattern, followed by drying.

13. The method for producing the field-effect transistor according to claim 12, wherein the photosensitive organic component comprises a compound generating a radical by light and a radical polymerizable compound.

14. The method for producing the field-effect transistor according to claim 12, wherein the photosensitive organic component comprises a compound generating an acid by light.

15. A wireless communication device comprising the field-effect transistor according to claim 1.

16. A goods tag comprising the wireless communication device according to claim 15.

\* \* \* \* \*